US008946567B2

(12) United States Patent
Nakatsu et al.

(10) Patent No.: US 8,946,567 B2
(45) Date of Patent: Feb. 3, 2015

(54) POWER MODULE, POWER CONVERTER DEVICE, AND ELECTRICALLY POWERED VEHICLE

(75) Inventors: Kinya Nakatsu, Hitachinaka (JP); Hiroshi Hozoji, Hitachiota (JP); Takeshi Tokuyama, Hitachi (JP); Yusuke Takagi, Hitachinaka (JP); Toshiya Satoh, Hitachiota (JP); Taku Oyama, Hitachi (JP); Takanori Ninomiya, Hiratsuka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 557 days.

(21) Appl. No.: 12/920,296

(22) PCT Filed: Oct. 30, 2009

(86) PCT No.: PCT/JP2009/068704
§ 371 (c)(1),
(2), (4) Date: Jul. 19, 2011

(87) PCT Pub. No.: WO2010/050594
PCT Pub. Date: May 6, 2010

(65) Prior Publication Data
US 2011/0299265 A1  Dec. 8, 2011

(30) Foreign Application Priority Data

Oct. 31, 2008  (JP) .................................. 2008-280682

(51) Int. Cl.
*H05K 7/00* (2006.01)
*H02M 7/00* (2006.01)
(Continued)

(52) U.S. Cl.
CPC .............. *H02M 7/003* (2013.01); *B60L 11/14* (2013.01); *B60L 11/18* (2013.01);
(Continued)

(58) Field of Classification Search
USPC .......... 174/252, 520, 547, 548; 361/820, 730, 361/688, 689, 702, 703, 709, 711, 713, 714, 361/715; 257/719, 712, 675, 714, 717, 707
See application file for complete search history.

(56) References Cited

U.S. PATENT DOCUMENTS

2007/0096278 A1* 5/2007 Nakatsu et al. ............... 257/678
2008/0251909 A1  10/2008 Tokuyama et al.

FOREIGN PATENT DOCUMENTS

EP  1 956 649 A2  8/2008
JP  2005-26627 A  1/2005
(Continued)

OTHER PUBLICATIONS

International Search Report dated Jan. 25, 2010 (three (3) pages).
Supplementary European Search Report dated Aug. 14, 2013 (eight (8) pages).

*Primary Examiner* — Hoa C Nguyen
*Assistant Examiner* — Amol Patel
(74) *Attorney, Agent, or Firm* — Crowell & Moring LLP

(57) ABSTRACT

A power module and a power converter device including the power module include: two base plates with their main surfaces facing each other; a semiconductor circuit unit disposed between the two base plates; a connecting member that is connected to the two base plates and forms a housing region in which the semiconductor circuit unit is housed; and an insulating member that is placed between the base plate and the semiconductor circuit unit and secures electrical insulation of the base plate and the semiconductor circuit unit. A rigidity or thickness of the connecting member is less than a rigidity or thickness of the base plate.

14 Claims, 28 Drawing Sheets

(51) Int. Cl.
*B60L 11/14* (2006.01)
*B60L 11/18* (2006.01)
*H05K 7/20* (2006.01)
*H01L 23/00* (2006.01)

(52) U.S. Cl.
CPC ........... *H05K 7/20927* (2013.01); *H01L 24/33* (2013.01); *Y02T 10/7005* (2013.01); *Y02T 10/7077* (2013.01); *H01L 2924/13055* (2013.01); *H01L 2924/13091* (2013.01)
USPC ........... 174/547; 174/520; 361/820; 361/730; 361/688

(56) References Cited

FOREIGN PATENT DOCUMENTS

| | | | | |
|---|---|---|---|---|
| JP | 2005026627 A | * | 1/2005 | ............ H01L 23/473 |
| JP | 2006-202899 A | | 8/2006 | |
| JP | 2007-53295 A | | 3/2007 | |
| JP | 2007-105249 A | | 4/2007 | |
| JP | 2008-29117 A | | 2/2008 | |
| JP | 2008-259267 A | | 10/2008 | |

* cited by examiner (1)  (2)

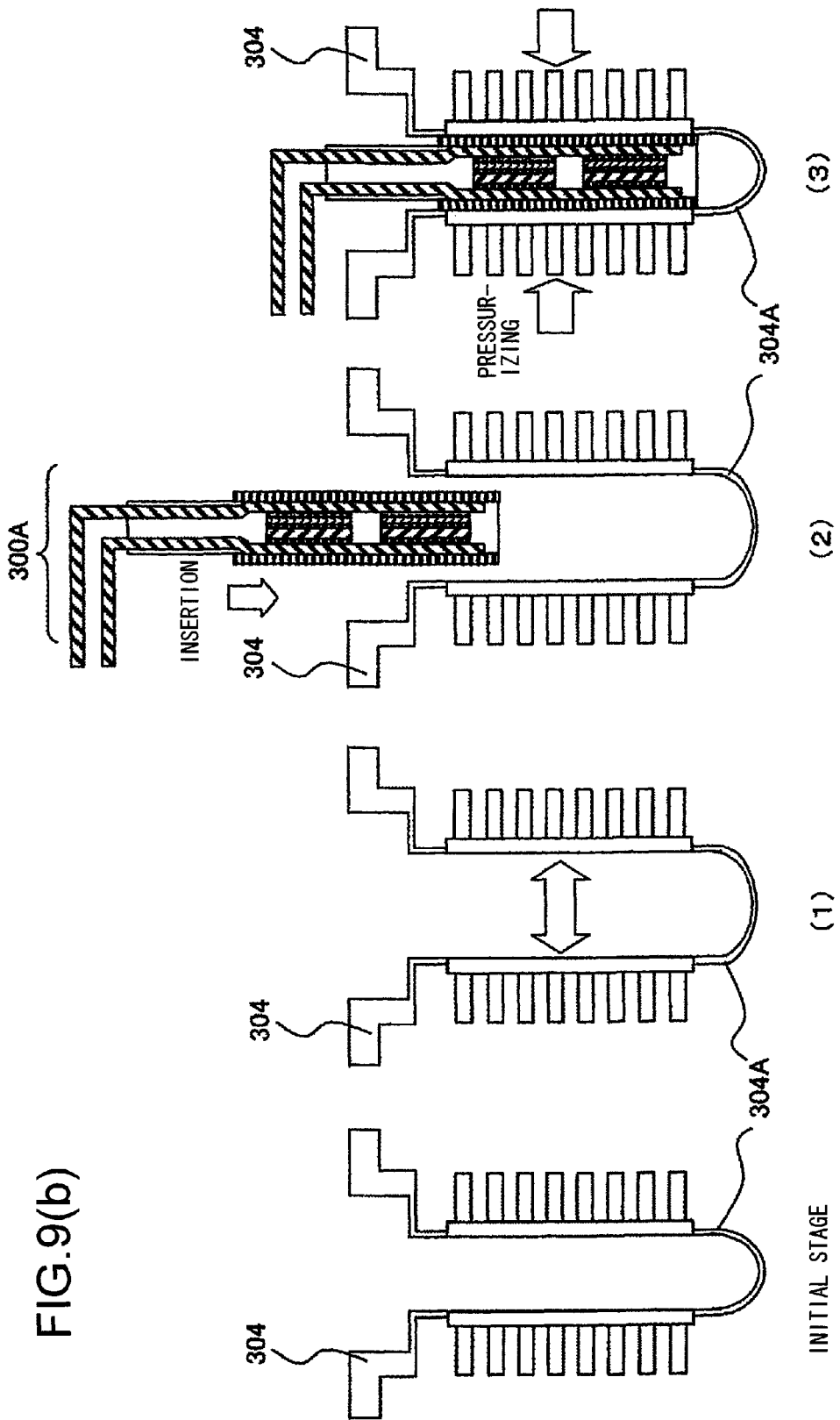

POWER MODULE, POWER CONVERTER DEVICE, AND ELECTRICALLY POWERED VEHICLE

TECHNICAL FIELD

The present invention relates to a power module that converts between direct current power and alternating current power, a power converter device that includes the power module, and an electrically powered vehicle that includes the power converter device.

BACKGROUND ART

A conventional power converter device has a power module that includes power semiconductors and converts between DC power and AC power by a switching operation of the power semiconductors. The power module further includes a base plate for heat dissipation, on which the power semiconductors are arranged. Heat generated by the power semiconductors is released to the base plate described earlier through a main surface on one side of the power semiconductors. On the base plate described earlier, in addition, fins are formed on a surface of the other side of the side where the power semiconductors are arranged, and a cooling medium contacts directly with the fins.

This kind of a power converter device is disclosed in Patent Reference Literature 1 for instance.

However, further improvement in cooling performance requires expansion in the heat dissipation area of the power semiconductors. Expansion in the heat dissipation area of the power semiconductors causes the power module structure to become complicated and leads to reduced productivity of the power module, thereby becoming a factor of cost rise of the power converter device.

[Patent Reference Literature 1] Japanese Laid-Open Patent Publication No. 2008-29117

SUMMARY OF THE INVENTION

Problems to be Solved by the Invention

The object of the present invention is to improve productivity of a power module

Means for Solving the Problems

In order to solve the above problem, in a power module and a power converter device including the power module according to the present invention, a semiconductor circuit unit having a semiconductor device is housed in a cylindrical case, and the semiconductor circuit unit is sandwiched and supported by inner walls of the case via an insulating member that secures electrical insulation.

Advantageous Effect of the Invention

According to the present invention, productivity of a power module and a power converter device can be improved.

BRIEF DESCRIPTION OF THE DRAWINGS

FIG. 9(b) is an illustration of an assembly flow of the CAN-like heat dissipating base and the resin molded type double-sided electrode module.

FIG. 12 (a) is a sectional view of the second power module according to an embodiment of the present invention and FIG. 12(b) is a side view of the second power module.

DESCRIPTION OF EMBODIMENTS

Figure 1:
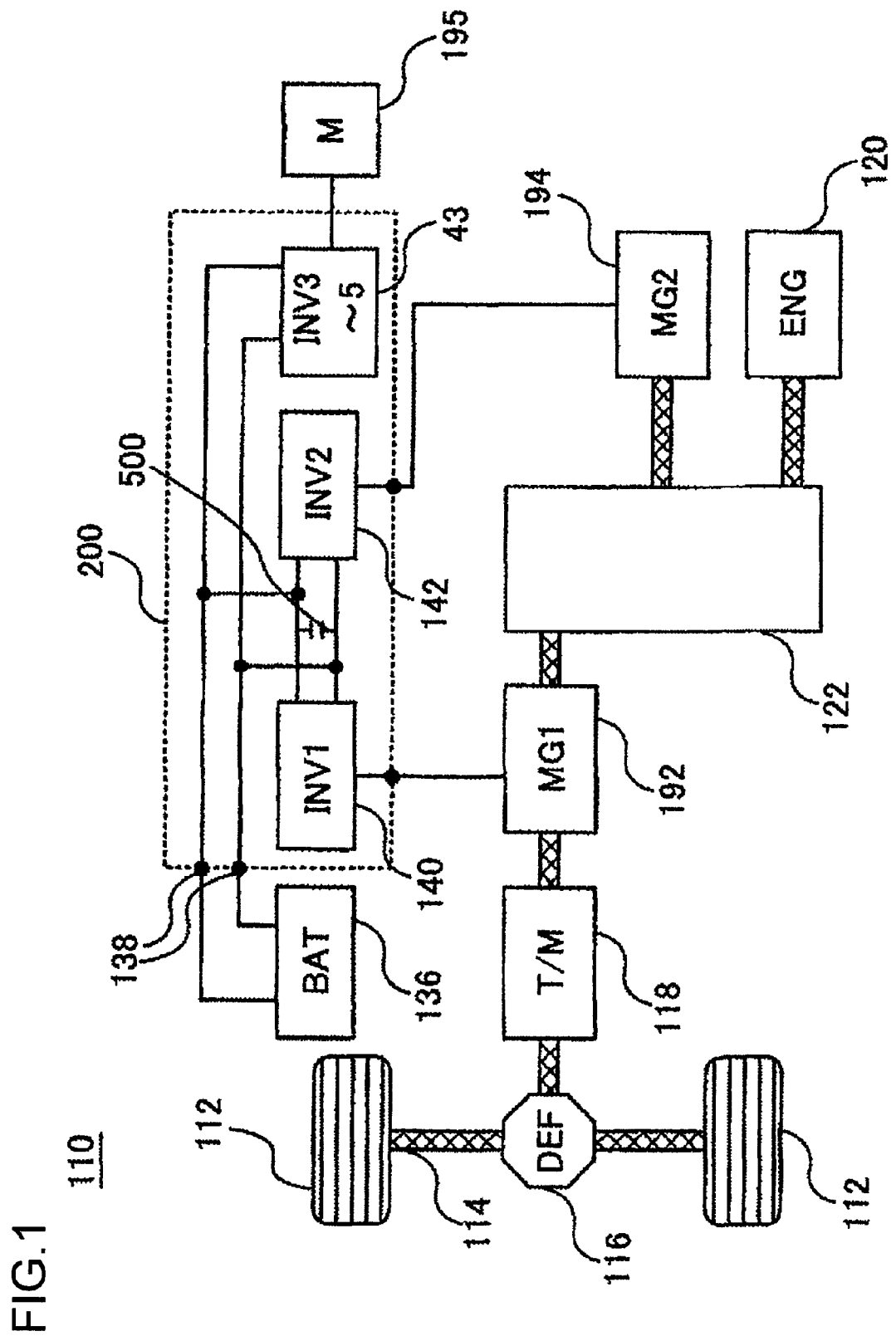
FIG. 1 is a diagram showing a control block of a hybrid vehicle.

An embodiment of the present invention described later has been designed to meet many demands required for commercialization. The content of PROBLEMS TO BE SOLVED BY THE INVENTION described above corresponds to one of the needs, and improved points related to other needs will now be explained.

One of demands of the power module and the power converter device according to the present invention is to improve cooling performance of the power module and the power converter device while improving productivity thereof.

The power module according to the present invention and the power converter device using the same are then characterized by comprising two base plates with their main surfaces facing each other, a semiconductor circuit unit disposed between the two base plates, a connecting member that is connected to the two base plates and forms a housing region in which the semiconductor circuit unit is housed; and an insulating member that is placed between the base plate and the semiconductor circuit unit and for securing electrical insulation of the base plate and the semiconductor circuit unit, wherein rigidity of the connecting member is less than that of the base plate.

As a result, the both sides of the semiconductor circuit unit can be cooled through each of the two base plates, thereby increasing the heat dissipation area. In addition, the rigidity of the connecting member is set to be less than that of the base plate. Therefore, by applying pressure to the two base plates that sandwich the semiconductor circuit unit, the power module case can be formed with ease, and the semiconductor circuit unit, the insulating member, and the base plate are connected so that the heat transfer path, through which heat can be exchanged with one another, can be formed with ease.

Another one of demands of the power module and the power converter device according to the present invention is to improve cooling performance of the power module and the power converter device while securing insulation properties thereof.

The power module according to the present invention and the power converter device using the same are then characterized by comprising a cylindrical case, a semiconductor circuit unit housed in a housing region formed in the case, and an insulating member for securing electrical insulation of an inner wall of the case and the semiconductor circuit unit, wherein the semiconductor circuit unit is sandwiched and supported by inner walls of the case and the insulating member is placed between an inner wall of the case and the semiconductor circuit unit, and the insulating member is a material that improves adhesion properties between the semiconductor circuit unit and the inner wall of the case by thermal processing.

The insulation properties between the semiconductor circuit unit and the inner wall of the case can be secured accordingly. In addition, adhesion properties between the semiconductor circuit unit and the inner wall of the case are improved so as to inhibit separation from occurring between the semiconductor circuit unit and the inner wall of the case and so as not to reduce thermal conductance in the heat transfer path from the semiconductor circuit unit to the case inner wall.

In addition, an outline of the power module and the power converter device according to the present embodiment will be explained before specific explanations are given on the power converter device according to an embodiment of the present invention.

The power module according to the present embodiment includes plate-like electrical wiring boards that are fixed to both electrodes that are provided on both side surfaces of a plate-like power semiconductor, allowing electric power to flow through and a thermal energy to be released from both sides of the power semiconductor. In addition, part of the electrical wiring boards and the power semiconductor are packed with a resin, and heat dissipation surfaces of both of the electrical wiring boards in the vicinity of the power semiconductor are exposed from part of the resin. The heat dissipation surfaces and resin surfaces form flat surfaces, and an adhesive insulation layer is formed on both of the formed flat surfaces. In addition, the power semiconductor, the electrical wiring boards, the part of resin, and both of the adhesive insulation layers are built into a CAN-like heat dissipating base which has two planes to be adhered to the formed adhesive insulation layer. Fins for heat dissipation are formed outside the CAN-like heat dissipating base so that heat can dissipate from the both sides of the power semiconductor through the fins.

In the power converter device according to the present embodiment, a cooling water path that can house the fins therein is provided in a case of the power converter device. An insert opening into which the power module described earlier can be inserted is provided on the side surface of the cooling water path. A sealed structure of the cooling medium that engages with a flange provided to the power module is formed on the periphery of the insert opening.

In addition, in the power converter device according to the present embodiment, a water path cover that seals the whole water path is provided on an opening of the cooling water path opposite to the insert opening, and the power module and the water path cover constitute a cooling jacket through which the cooling medium flows. The power module is cooled by submerging it into the cooling water path. A circuit that controls the power semiconductor and controls the electric power supply to a load is housed in a region in which the electrical wiring board of the power module protrudes, and a capacitor for smoothing the electric power and a circuit that boosts input voltage are included in a region below the water cooling jacket.

The power converter device according to an embodiment of the present invention will now be explained in detail with reference to the drawings. The power converter device according to an embodiment of the present invention can be applied to a hybrid vehicle and a pure electric vehicle. As a representative example, the control structure and the circuit structure of the power converter device when the power converter device according to an embodiment of the present invention is applied to a hybrid vehicle will now be explained with reference to FIG. 1 and FIG. 2.

With regard to the power converter device according to an embodiment of the present invention, an explanation will be made in terms of an example of a vehicle-mounted power converter device of a vehicle-mounted electric machine system to be mounted on a vehicle, in particular, an inverter device for driving a vehicle used in an electric machine system for driving a vehicle, with the inverter device mounted and operated under a very harsh environment. The inverter device for driving a vehicle is included in an electric machine system for driving a vehicle as a control device that controls drive of an electric machine for driving a vehicle. The inverter device converts DC power supplied from a vehicle-mounted battery that constitutes a vehicle-mounted power source or from a vehicle-mounted power generation device into predetermined AC power, and supplies the obtained AC power to the electric machine for driving a vehicle, so as to control drive of the electric machine for driving a vehicle. In addition, since the electric machine for driving a vehicle has a function as an electric generator, the inverter device for driving a vehicle has a function to convert AC power generated by the electric machine for driving a vehicle into DC power according to an operation mode. The converted DC power is supplied to the vehicle-mounted battery.

It is to be noted that, while the present embodiment is configured to be most appropriate for a power converter device for driving a vehicle, such as an automobile a truck, and the like, the present invention can also be applied to other power converter devices. For instance, it can be applied to a power converter device of an electric train, a vessel, an aircraft, and the like, an industrial power converter device used as a control device for an electric machine that drives plant equipment, or a household power converter device used for a control device of an electric machine that drives a household photovoltaic power generation system and a household electrical appliances.

FIG. 1 is a diagram showing a control block of a hybrid vehicle. In FIG. 1, a hybrid electric vehicle (hereinafter referred to as "HEV") 110 is an electrically powered vehicle that includes two vehicle drive systems. One of them is an engine system with an engine 120, which is an internal combustion engine, as a power source. The engine system is mainly used as a driving source for the HEY 110. The other of them is a vehicle-mounted electric machine system with motor generators MG1 192 and MG2 194 as power sources. The vehicle-mounted electric machine system is mainly used as a driving source for the HEV 110 and an electric power generation source for the HEV 110. The motor generators MG1 192 and MG2 194, which are, for example, synchronous machines or induction machines, work as motors or electric generators depending upon the operational method, and hence they are herein referred to as motor generators.

A front axle 114 is rotatably and pivotally supported in a front portion of the vehicle body. A pair of front wheels 112 is provided at both ends of the front axle 114. A rear axle (not shown in the figures) is rotatably and pivotally supported in a rear portion of the vehicle body. A pair of rear wheels is provided at both ends of the rear axle. While the HEV 110 of the present embodiment adopts a so-called front-wheel drive method, in which the front wheels 112 work as primary wheels to be driven on power and the rear wheels work as secondary wheels that follow, it may adopt the contrary, i.e., a rear-wheel drive method.

A front wheel-side differential gear (hereinafter referred to as "front wheel-side DEF") 116 is provided at the middle of the front axle 114. The front axle 114 is mechanically connected to an output side of the front-wheel side DEF 116. An output shaft of the transmission 118 is mechanically connected to an input side of the front-wheel side DEF 116. The front-wheel side DEF 116 is a differential power distribution mechanism that distributes rotational driving force that has been transmitted through the transmission 118 to the right and left of the front axle 114. An output side of the motor generator 192 is mechanically connected to an input side of the transmission 118. An output side of the engine 120 and an output side of the motor generator 194 are mechanically connected to an input side of the motor generator 192 through a power distribution mechanism 122. It is to be noted that the motor generators 192 and 194 and the power distribution mechanism 122 are stored inside a housing of the transmission 118.

The motor generators 192 and 194 are synchronous machines including permanent magnets in rotors, and their drives are controlled as AC power to be supplied to armature windings of stators is controlled by inverter devices 140 and 142. A battery 136 is connected to the inverter devices 140 and 142, so that electric power can be transferred between the battery 136 and the inverter devices 140 and 142.

In the present embodiment, the HEV 110 includes two electric motor generator units, i.e., a first electric motor generator unit constituted with the motor generator 192 and the inverter device 140 and a second electric motor generator unit constituted with the motor generator 194 and the inverter device 142, to be used according to the operational status. More specifically, in order to assist drive torque of the vehicle in a situation in which the vehicle is driven on power from the engine 120, the second electric motor generator unit is activated, as a power generation unit, on power of the engine 120 so that it generates electric power, and electric power obtained by the power generation causes the first electric motor generator unit to be activated as a motorized unit. In addition, when assisting the vehicle speed in a similar situation, the first electric motor generator unit is activated, as a power generation unit, on power of the engine 120 so that it generates electric power, and electric power obtained by the power generation causes the second electric motor generator unit to be activated as a motorized unit.

In the present embodiment, the first electric motor generator unit is activated on electric power of the battery 136 as a motorized unit so that the vehicle can be driven only on power of the motor generator 192. Furthermore, in the present embodiment, the first electric motor generator unit or the second electric motor generator unit is activated, as a power generation unit, on power of the engine 120 or power from the wheels so as to generate electric power so that the battery 136 can be charged.

The battery 136 is also used as a power source for driving a motor 195 for auxiliaries. The auxiliaries include a motor that drives a compressor of an air conditioner or a motor that drives a hydraulic pump for controlling. DC power supplied from the battery 136 to an inverter device 43 is converted into AC electric power by the inverter 43 for auxiliaries and supplied to the motor 195. The inverter 43 for auxiliaries has the same function as the inverter devices 140 and 142 have, which controls phase, frequency, and electric power of AC to be supplied to the motor 195. For instance, by supplying lead phase AC power with respect to rotation of the rotor of the motor 195, the motor 195 generates torque. On the other hand, by generating lagging phase AC power, the motor 195 works as an electric generator and the motor 195 operates in a regenerative braking state. Such a control function of the inverter 43 for auxiliaries is the same as the control function of the inverter devices 140 and 142. Since the capacity of the motor 195 is less than that of the motor generators 192 and 194, the maximum conversion electric power of the inverter 43 for auxiliaries is less than that of the inverter devices 140 and 142. However, the circuit configuration of the inverter 43 for auxiliaries is basically the same as that of the inverter devices 140 and 142.

The inverter devices 140, 142, and 43 and a capacitor module 500 are in an electrically close relationship. They require in common further measures against heat generation. In addition, the volume of the device is desirably designed to be as small as possible. From those points, a power converter device 200 described later in detail houses the inverter devices 140, 142, and 43 and the capacitor module 500 in the housing of the power converter device 200. This configuration allows the number of harnesses to be reduced and radiated noise and the like to be reduced, thereby achieving a small sized, highly reliable power converter device.

Arranging the inverter devices 140, 142, and 43 and the capacitor module 500 in one housing is effective in simplifying wiring and against noise. In addition, inductance in the connection circuit of the capacitor module 500 and the inverter devices 140, 142, and 43 can be reduced so that spike voltage can be reduced, and reduction in heat generation and improved heat dissipation efficiency can be achieved.

Figure 2:
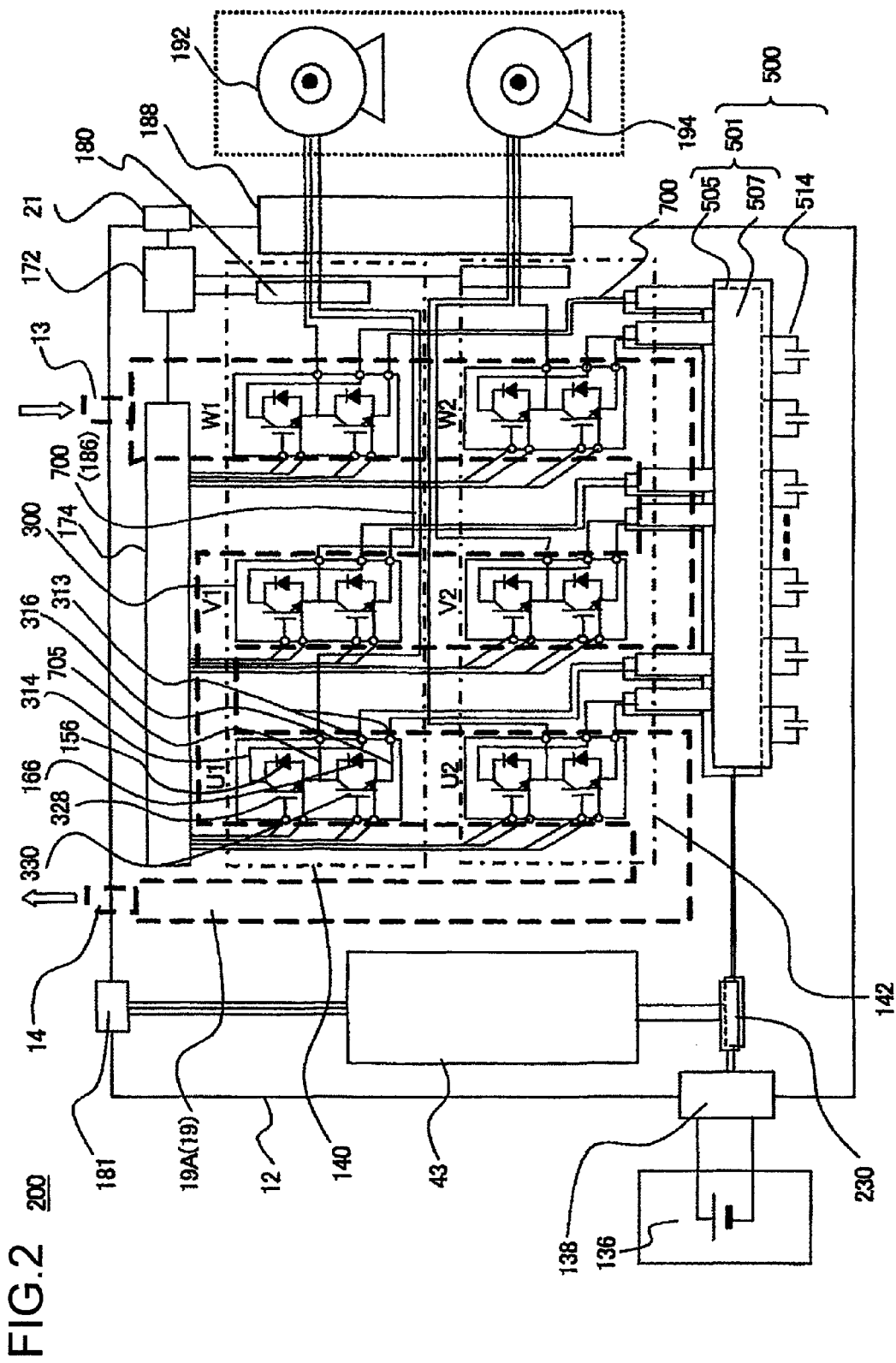
FIG. 2 is a diagram explaining the circuit structure of a power converter device.

Next, the circuit configuration of the power converter device 200 will be explained with reference to FIG. 2. As shown in FIG. 1, the power converter device 200 includes the inverter devices 140 and 142, the inverter device 43 for auxiliaries, and the capacitor module 500.

The inverter devices 140 and 142 constitute three-phase bridge circuits by connecting a plurality of the double-sided cooling power modules 300. As described later, each of the power modules has power semiconductor devices, connection wiring, an opening shown in a reference numeral 304 in FIG. 6, and includes a can-like-shaped heat dissipating base 304 (hereinafter referred to as "CAN-like heat dissipating base"), which is closed except a surface of the opening, and the like. The CAN-like heat dissipating base 304 is a cooling device that has an exterior wall which is made of the same material as heat dissipating bases facing each other and is formed seamlessly with both the heat dissipating bases so as to cover the periphery of the heat dissipating bases, with the opening provided on a part of the exterior wall and the power semiconductors housed in the opening. The inverter 43 for auxiliaries constitutes an inverter device, a boost circuit, and a buck circuit.

Each of the inverter devices 140 and 142 is driven and controlled by two driver circuits provided in a control unit. In FIG. 2, a set of the two driver circuits is indicated as a driver circuit 174. Each of the driver circuits is controlled by a control circuit 172. The control circuit 172 generates a switching signal for controlling switching timing of the power semiconductor devices for switching.

The inverter device 140 is constituted with the three-phase bridge circuit and includes, for each of the U phase (represented by a reference numeral U1), the V phase (represented by a reference numeral V1), and the W phase (represented by a reference numeral W1), a positive electrode side semiconductor switch unit that is connected to the positive electrode side and a negative electrode side semiconductor switch unit that is connected to the negative electrode side. The positive electrode side semiconductor switch unit and the negative electrode side semiconductor switch unit constitute an upper and lower arm series circuit. The positive electrode side semiconductor switch unit includes an IGBT 328 (insulated gate bipolar transistor) and a diode 156 for the upper arm, which are power semiconductor device for switching. The negative electrode side semiconductor switch unit includes an IGBT 330 and a diode 166 for the lower arm. Each upper and lower arm series circuit is electrically connected in parallel between a DC positive electrode wiring board 314 and a DC negative electrode wiring board 316.

The IGBT 328 for the upper arm and the IGBT 330 for the lower arm are hereinafter referred to as the IGBTs 328 and 330.

The IGBTs 328 and 330 operate upon reception of a drive signal output from one of the driver circuits of the driver circuit 174 so as to convert DC power supplied from the battery 136 into three-phase AC power. The converted electric power is supplied to an armature winding of the motor generator 192. It is to be noted that display of the reference numerals 328, 330, 156, and 166 will be curtailed with regard to the V phase and the W phase. The power module 300 of the inverter device 142 has the same configuration as that of the inverter device 140, and the inverter 43 for auxiliaries has the same configuration as that of the inverter device 142, and therefore explanations will be curtailed herein.

In the present embodiment, an example of power semiconductor devices for switching is shown with the IGBTs 328 and 330. The IGBTs 328 and 330 include collectors, emitters (emitter terminals for signals), and gate electrodes (gate electrode terminals). The diodes 156 and 166 are electrically connected between the collectors and the emitters of the IGBTs 328 and 330 as illustrated. The diodes 156 and 166 include two electrodes, i.e., cathodes and anodes, and the cathodes are electrically connected to the collectors of the IGBTs 328 and 330 and the anodes are electrically connected to the emitters of the IGBTs 328 and 330 so that the directions from the emitter to the collectors of the IGBTs 328 and 330 become the forward directions. A MOSFET (metal-oxide semiconductor field-effect transistor) may be used as a power semiconductor device for switching. In that case, the diode 156 and the diode 166 are unnecessary.

Based upon input information from a control device, a sensor (for instance, an electric current sensor 180), or the like on the vehicle side, the control circuit 172 generates a timing signal for controlling switching timing of the IGBTs 328 and 330. Based upon the timing signal output from the control circuit 172, the driver circuit 174 generates a drive signal for operating switching of the IGBTs 328 and 330.

The control circuit 172 includes a microcomputer for calculating and processing switching timing of the IGBTs 328 and 330. A desired torque value required for the motor generator 192, a current value supplied from the upper and lower arm series circuit to the armature winding of the motor generator 192, and a magnetic pole position of the rotor of the motor generator 192 are input to the microcomputer as input information. The desired torque value is based upon a command signal output from a higher-order control device not illustrated. The current value is detected based upon a detection signal output from the electric current sensor 180. The magnetic pole position is detected based upon a detection signal output from a rotating magnetic pole sensor (not shown in the figures) provided in the motor generator 192. While in the present embodiment the explanation is made based upon an example of a case in which three phase current values are detected, it may be configured that two phase current values are detected.

Based upon the desired torque value, the microcomputer in the control circuit 172 calculates current command values of d axis and q axis of the motor generator 192 and, based upon a difference between the calculated current command values of the d axis and q axis and the detected current values of the d axis and q axis, calculates voltage command values of the d axis and q axis. Furthermore, based upon the detected magnetic pole position, the microcomputer converts the calculated voltage command values of the d axis and q axis into the voltage command values of the U phase, the V phase, and the W phase. The microcomputer then generates a pulse-like modulated wave based upon a comparison between a fundamental wave (sine wave) and a carrier wave (triangle wave) based upon the voltage command values of the U phase, the V phase, and the W phase, and outputs the generated modulated wave to the driver circuit 174 as a PWM (pulse-width modulated signal).

When driving the lower arm, the driver circuit 174 amplifies the PWM signal and outputs the amplified signal as a drive signal to the gate electrode of the IGBT 330 of a corresponding lower arm. When driving the upper arm, on the other hand, the driver circuit 174 shifts the reference potential level of the PWM signal to the reference potential level of the upper arm before amplifying the PWM signal, and outputs the amplified signal as a drive signal to the gate electrode of the IGBT 328 of a corresponding upper arm. As a result, switching of each of the IGBTs 328 and 330 is operated based upon the input drive signal.

In addition, the control unit performs abnormality detection (over current, over voltage, over temperature, and the like) so as to protect the upper and lower arm series circuit. For this purpose, sensing information is input to the control unit. For instance, information on current flowing through the emitter of each of the IGBTs 328 and 330 is input from a signal emitter terminal of each arm to the corresponding driver circuit 174. This allows the driver circuit 174 to perform over current detection, to stop the switching operation of the corresponding IGBTs 328 and 330 if over current is detected, and to protect the corresponding IGBTs 328 and 330 from the over current. Information on temperature at the upper and lower arm series circuit is input to the microcomputer from a temperature sensor (not shown in the figures) provided in the upper and lower arm series circuit. Information on voltage at the DC positive electrode side of the upper and lower arm series circuit is also input to the microcomputer. Based upon those pieces of information, the microcomputer performs over temperature detection and over voltage detection, stops the switching operations of all of the IGBTs 328 and 330 if over temperature or over voltage is detected, and protects the upper and lower arm series circuit from the over temperature or the over voltage.

Conduction and interruption actions of the IGBTs 328 and 330 of the upper and lower arms of the inverter device 140 are switched in a fixed order, and the current generated at the stator winding of the motor generator 192 during the switching flows through a circuit that includes the diodes 156 and 166. It is to be noted that although, in the power converter device 200 of the present embodiment, one upper and lower arm series circuit is provided for each of the phases of the inverter device 140, the power converter device may have a circuit configuration in which two upper and lower arm series circuits are connected in parallel for each of the phases as a circuit that generates an output of each of the phases of three-phase AC to be output to the motor generators.

DC terminals 313 provided in each of the inverter devices 140 and 142 are connected to a common laminated conductor plate 700. The laminated conductor plate 700 constitutes a laminated wiring board with a three-layer structure in which an insulation sheet 706 (not shown in the figures) is sandwiched by a positive electrode-side conductor plate 702 and a negative electrode-side conductor plate 704, which are formed from conductive plates with wider widths in an array direction of the power modules. The positive electrode-side conductor plate 702 and the negative electrode-side conductor plate 704 of the laminated conductor plate 700 are connected to a positive conductor plate 507 and a negative conductor plate 505 of a laminated wiring board 501 provided in the capacitor module 500, respectively. The positive conductor plate 507 and the negative conductor plate 505, which are formed from conductive plates with wider widths in an array direction of the power modules, also constitute a laminated wiring board with a three-layer structure in which an insulation sheet 517 (not shown in the figures) is sandwiched.

A plurality of capacitor cells 514 are connected in parallel to the capacitor module 500, in which the positive electrode side of the capacitor cells 514 is connected to the positive conductor plate 507 and the negative electrode side is connected to the negative conductor plate 505. The capacitor module 500 constitutes a smoothing circuit for inhibiting fluctuation in the DC voltage generated by the switching operation of the IGBTs 328 and 330.

The laminated wiring board 501 of the capacitor module 500 is connected to an input laminated wiring board 230 that is connected to a DC connector of the power converter device 200. An inverter device in the inverter 43 for auxiliaries is also connected to the input laminated wiring board 230. A noise filter is provided between the input laminated wiring board 230 and the laminated wiring board 501. The noise filter includes two capacitors that connect a ground terminal of a housing 12 with each DC power line so as to constitute a Y capacitor for measures against common mode noise.

Figure 10A:
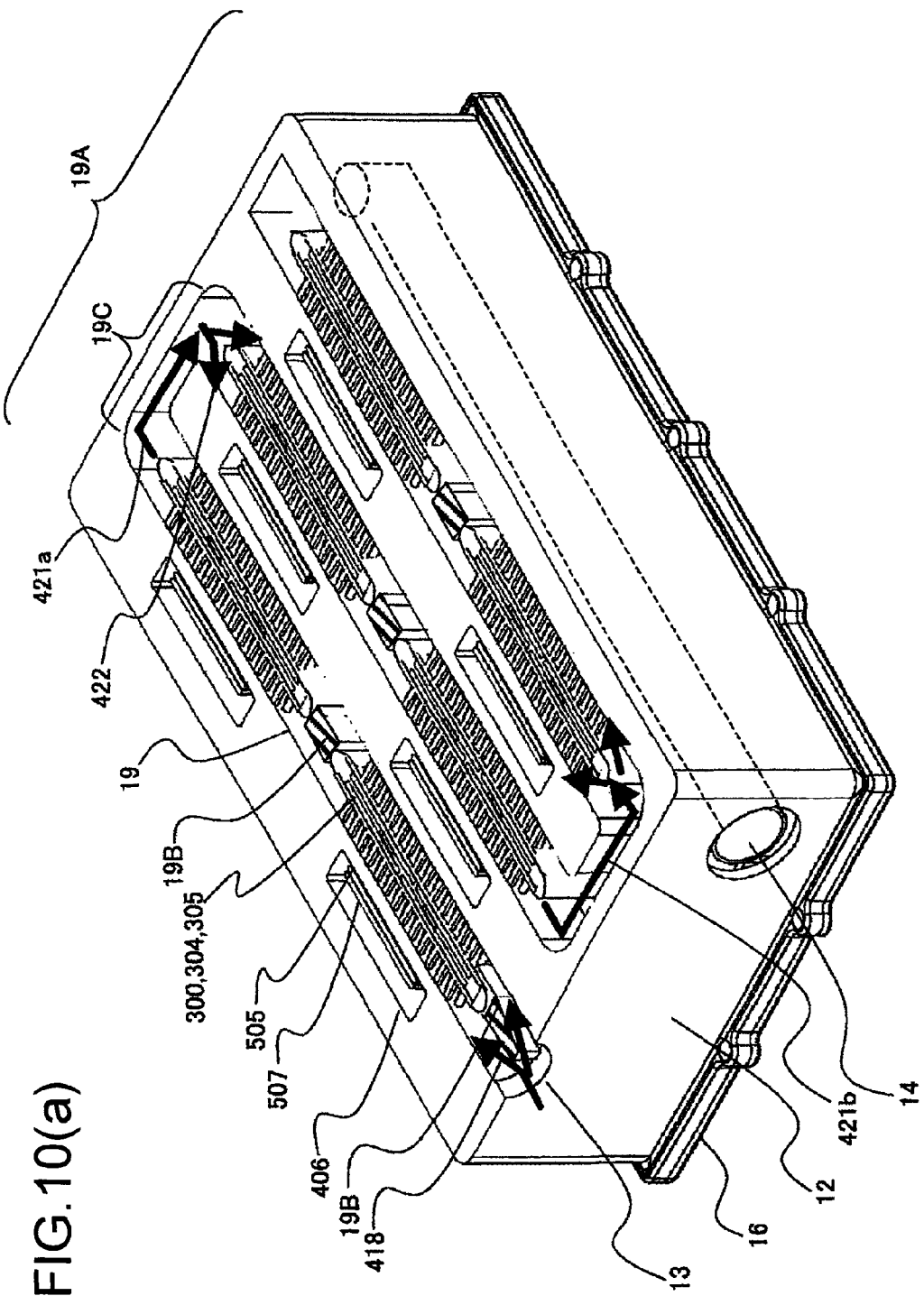
FIG. 10(a) is a perspective view of a housing in which a cooling water inlet pipe and an outlet pipe are attached to an aluminium cast of the housing including a cooling water flow path.
Figure 10B:
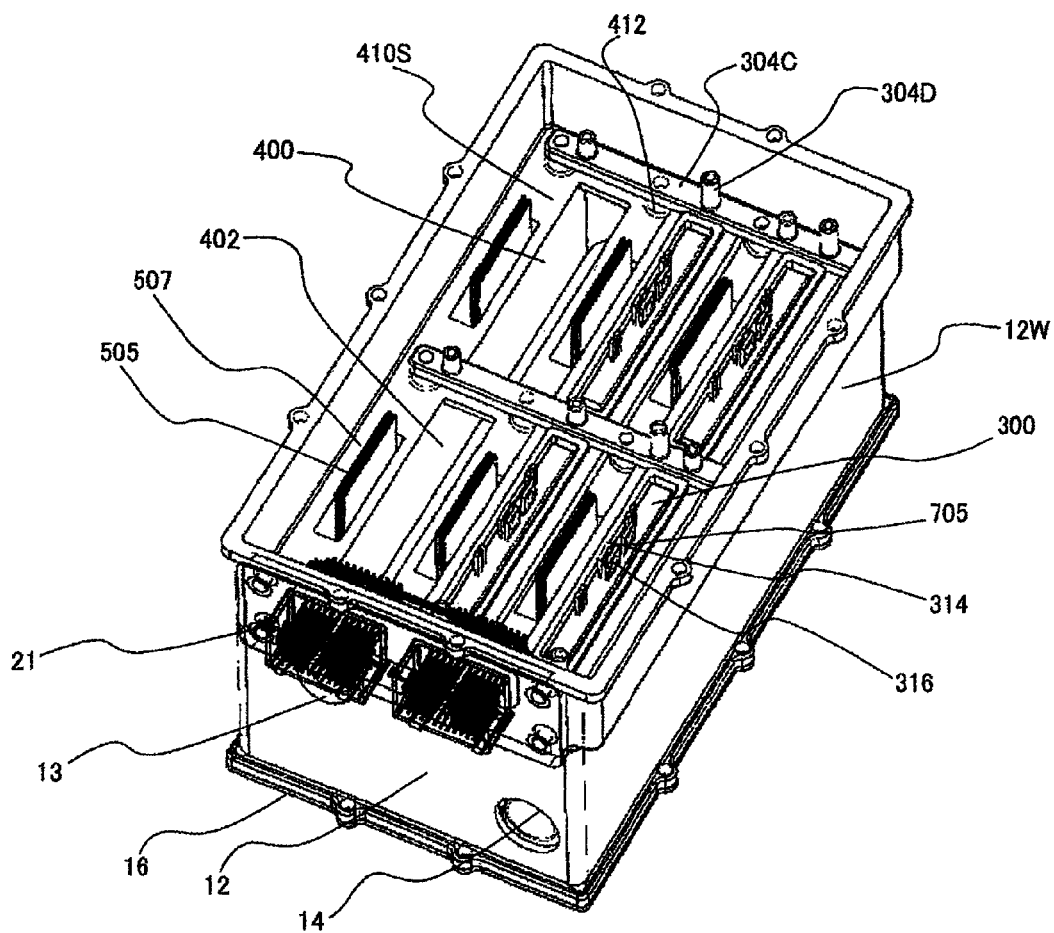
FIG. 10(b) is a top view of the housing in which the cooling water inlet pipe and the outlet pipe are attached to the aluminium cast of the housing including the cooling water flow path.
Figure 10C:
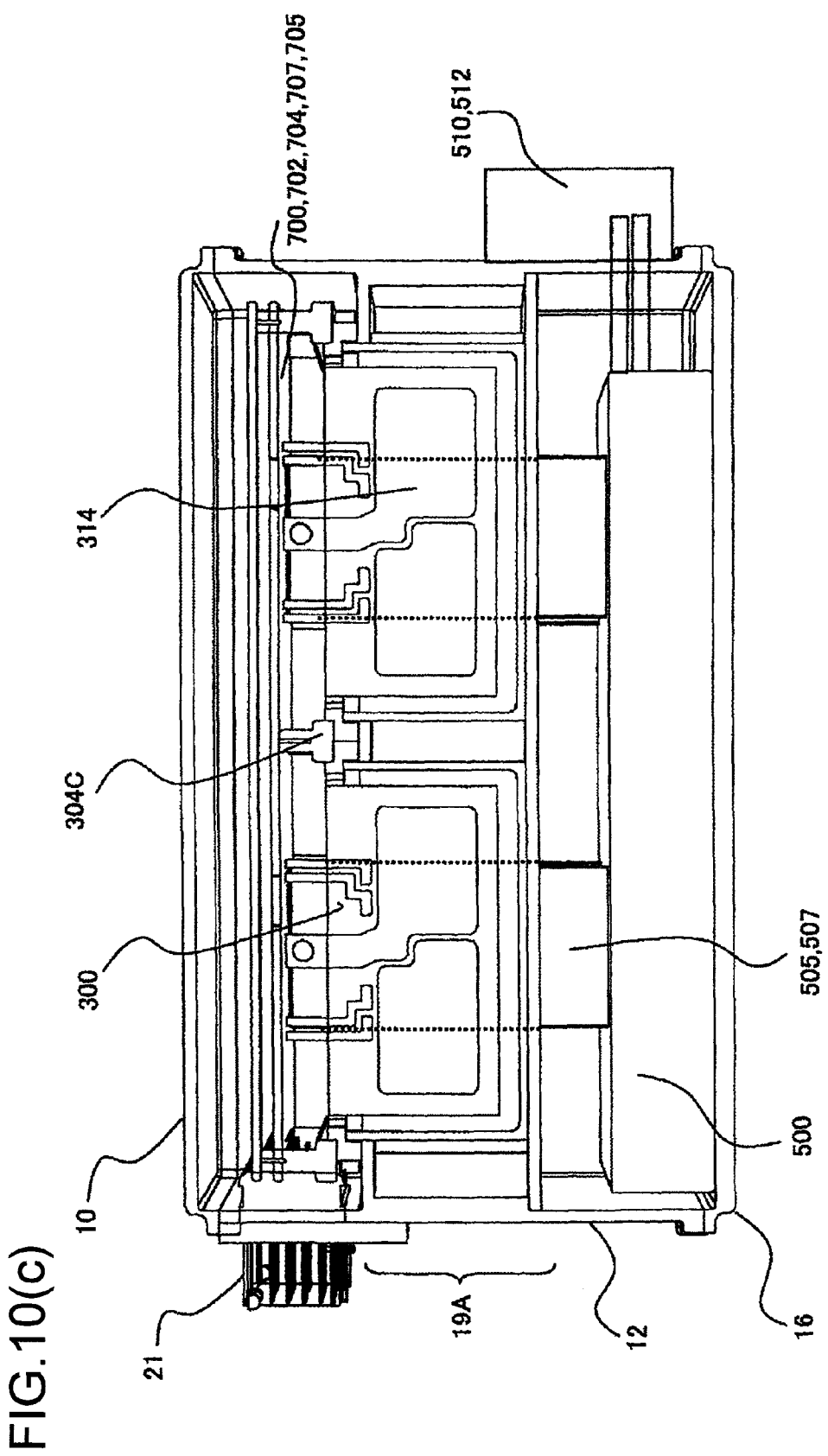
FIG. 10(c) is a sectional view of the housing in which the cooling water inlet pipe and the outlet pipe are attached to the aluminium cast of the housing including the cooling water flow path.

As shown in FIG. 10 (*a*), a reference numeral 19A represents a cooling jacket on which a cooling water flow path is formed, and the cooling water flows in through a cooling water inlet pipe 13, flows back and forth in a U shape as indicated by arrows, and flows out through a cooling water outlet pipe 14. The inverter circuits 140 and 142 are arranged on a route through which the cooling water flows back and forth, and in either of the inverter circuits, the IGBT and the diode of the upper arm side are arranged on the forward path side of the cooling water path and the IGBT and the diode of the lower arm side are arranged on the return path side of the cooling water path.

In FIG. 3 to FIG. 6, the reference numeral 200 represents the power converter device, a reference numeral 10 represents an upper case, a reference numeral 11 represents a metal base plate, a reference numeral 12 represents the housing, the reference numeral 13 represents the cooling water inlet pipe, the reference numeral 14 represents the cooling water outlet pipe, a reference numeral 420 represents a water path back cover, a reference numeral 16 represents a lower case, a reference numeral 17 represents an AC terminal case, a reference numeral 18 represents an AC output wiring, a reference numeral 19 represents the cooling water flow path, and a reference numeral 20 represents a control circuit board that holds the control circuit 172. A reference numeral 21 represents a connector for external connection, and a reference numeral 22 represents a drive circuit board that holds the driver circuit 174. The control unit is thus constituted with the control circuit board 20, the control circuit 172, the drive circuit board 22, and the driver circuit 174. The reference numeral 300 represents a power module (double-sided electrode module), and three power modules are provided in each inverter. One set of the power modules 300 constitutes the inverter device 142 and the other set of the power modules 300 constitutes the inverter device 140. The reference numeral 700 represents the laminated conductor plate, a reference numeral 800 represents a liquid seal, the reference numeral 304 represents the CAN-like heat dissipating base, the reference numeral 314 represents the DC positive electrode wiring board, the reference numeral 316 represents the DC negative electrode wiring board, the reference numeral 500 represents the capacitor module, the reference numeral 505 represents the negative conductor plate, the reference numeral 507 represents the positive conductor plate, and the reference numeral 514 represents the capacitor cells.

Figure 3:
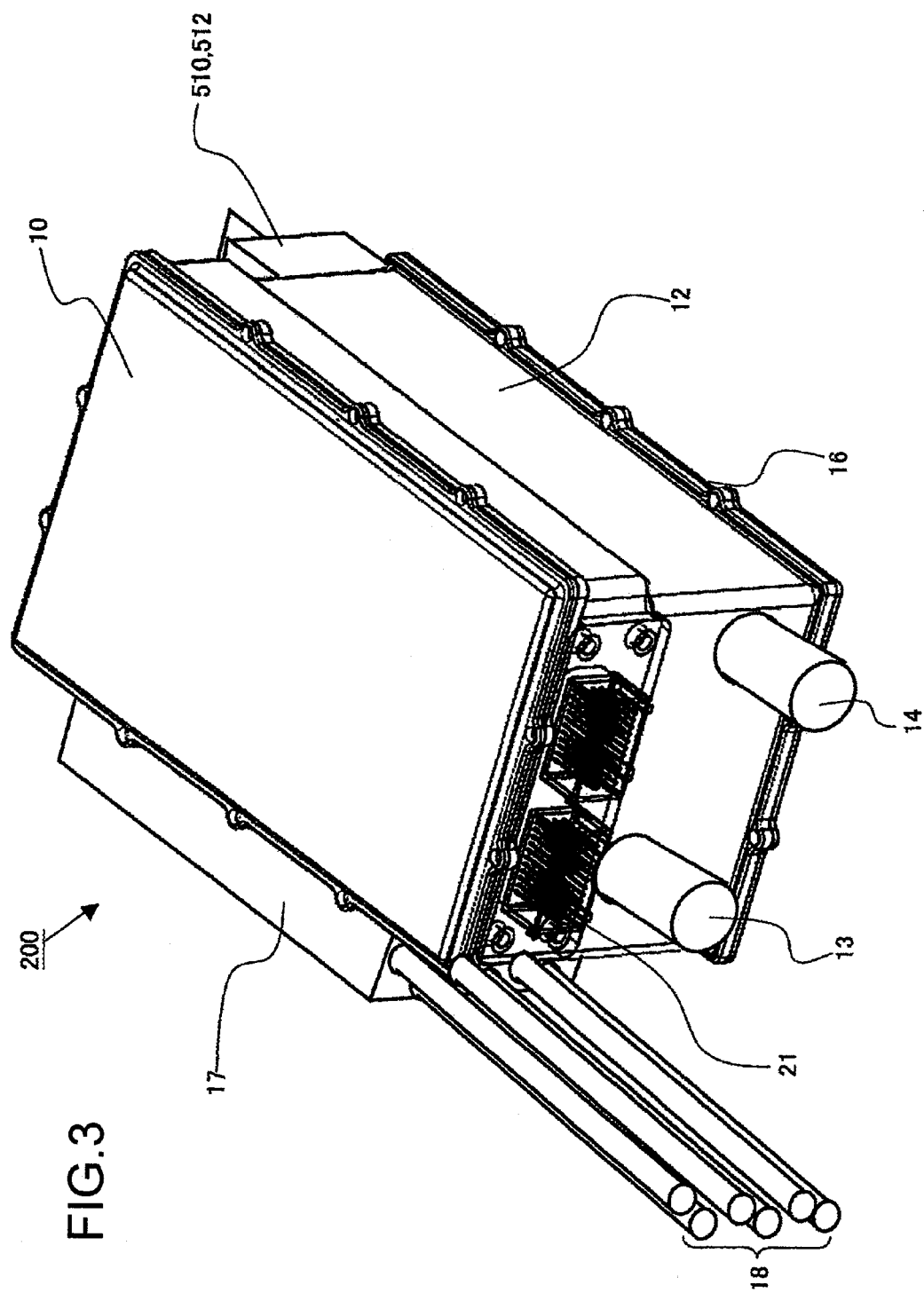
FIG. 3 is an external perspective view of the power converter device according to an embodiment of the present invention.

FIG. 3 shows an external perspective view of the power converter device 200 according to an embodiment of the present invention. The power converter device 200 according to the present embodiment includes the following appearance parts, that is, the housing 12 with a substantially rectangular upper surface or bottom surface, the cooling water inlet pipe 13 and the cooling water outlet pipe 14 provided on one of outer circumferences on the short side of the housing 12, the upper case 10 for covering an upper opening of the housing 12, and the lower case 16 for covering a lower opening of the housing 12. The shape of the bottom surface side or the upper surface side of the housing 12 is formed to be substantially rectangular so as to be mounted on a vehicle with ease and manufactured with ease, in particular in mass production.

The AC terminal case 17 used for connection with each of the motor generators 192 and 194 is provided on the outer circumference on the long side of the power converter unit 200. The AC output wiring 18 is used for electrically connecting the power module 300 with the motor generators 192 and 194. The alternating current output from the power module 300 is transmitted to the motor generators 192 and 194 through the AC output wiring 18.

The connector 21 is connected to the control circuit board 20 housed in the housing 12. A variety of signals from outside are transmitted to the control circuit board 20 through the connector 21. A DC (battery) negative electrode side connection terminal unit 510 and a DC (battery) positive electrode side connection terminal unit 512 electrically connect the battery 136 with the capacitor module 500. Here, in the present embodiment, the connector 21 is provided on one side of the outer circumference surface of the short side of the housing 12. On the other hand, the DC (battery) negative electrode side connection terminal unit 510 and the DC (battery) positive electrode side connection terminal unit 512 are provided on the outer circumference surface of the short side that is opposite to the side on which the connector 21 is provided. In other words, the connector 21 and the DC (battery) negative electrode side connection terminal unit 510 are arranged separately. This results in reduction in the noise that comes into the housing 12 through the DC (battery) negative electrode side connection terminal unit 510 and is then propagated to the connector 21, thereby improving controllability of the motor by the control circuit board 20. The terminal units 510 and 512 are provided in a DC connector 138 of FIG. 2.

Figure 4:
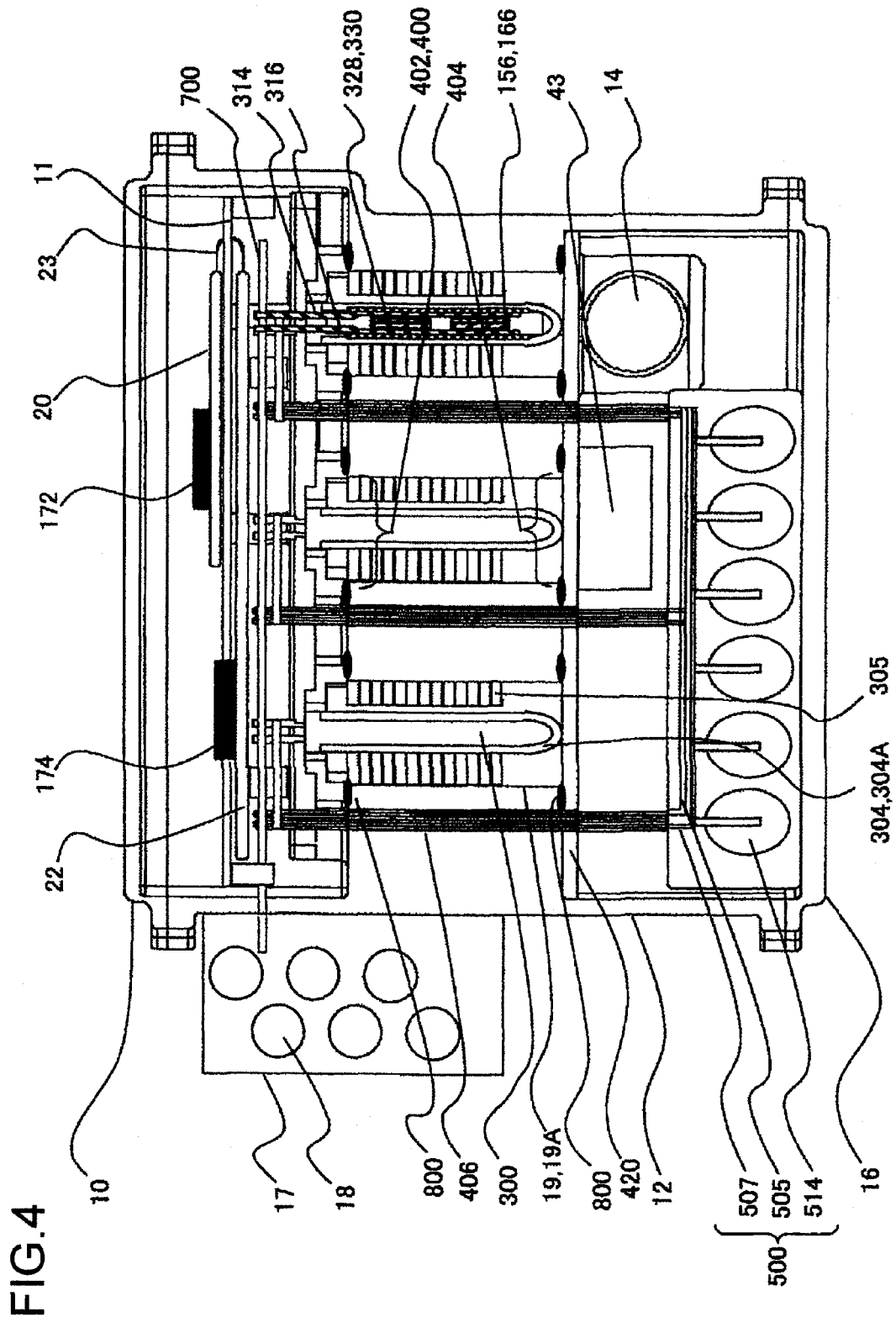
FIG. 4 is a sectional view of the power converter device according to an embodiment of the present invention.

FIG. 4 is a sectional view of the power converter device according to an embodiment of the present invention.

As shown in FIG. 4, the cooling jacket 19A in which the cooling water flow path 19 is formed is provided in the middle of the housing 12, and, on the top of the cooling jacket 19A, there are two sets of openings 400 and 402 each formed in three rows along the direction of the flow, which constitute six openings (refer to FIG. 10 (b)). Each of the power modules 300 is fixed to the upper surface of the cooling jacket 19A through the liquid seal 800. Fins 305 for heat dissipation are provided opposite to each other on the CAN-like heat dissipating base 304 of each of the power modules 300. The fins 305 of each of the power modules 300 each protrude into the cooling water flow path 19 through the openings 400 and 402 of the cooling jacket 19A. The protruding CAN-like heat dissipating base 304 and a column-like part of the cooling jacket 19A separate the cooling water path 19 to the right and left and cause the cooling medium to shunt and flow separately through the opposite fins 305. The cooling water path 19 is provided in the cooling jacket 19A as it meanders in S shape so that it can cool six power modules arranged in series.

An opening 404 is formed along the cooling water path 19 on the lower surface of the cooling jacket 19A, and the opening 404 is covered with the lower water path back cover 420. The inverter 43 for auxiliaries is mounted and cooled on the lower surface of the cooling jacket 19A. The inverter 43 for auxiliaries is fixed to the lower surface of the lower water path back cover 420 so that heat dissipation metal surfaces of housed power modules and the like (not shown in the figures) face the lower surface of the cooling jacket 19A. The liquid seal 800 is provided between the lower water path back cover 420 and the housing 12. While the liquid seal is used as a sealing material in the present embodiment, a resin material, a rubber O-ring, packing, or the like may be used in place of the liquid seal. A use of a liquid seal can improve assemblability of the power converter unit 200.

The lower case 16 is provided below the cooling jacket 19A, and the capacitor module 500 is provided in the lower case 16. The capacitor module 500 is fixed on a bottom plate inner surface of the lower case 16 so that the heat dissipation surface of the metal case of the capacitor module 500 contacts the bottom plate inner surface of the lower case 16. This configuration allows the power modules 300 and the inverter 43 for auxiliaries to be efficiently cooled using the upper surface and the lower surface of the cooling jacket 19A, thereby resulting in a power converter device reduced in size.

While the housing 12, in which the cooling jacket 19A is provided, is cooled. the lower case 16 provided below the housing 12 is also cooled. As a result, heat in the capacitor module 500 is thermally conducted to the cooling water through the lower case 16 and the housing 12, and thus the capacitor module 500 is cooled.

The laminated conductor plate 700 for electrically connecting the power modules 300 with the capacitor module 500 is arranged above the power modules 300. The laminated conductor plate 700 spans over the input terminal 313 of each of the power modules 300 so as to connect each of the power modules 300 in parallel. The laminated conductor plate 700 is constituted with the positive electrode-side conductor plate 702 (refer to FIG. 20), which is connected with the positive conductor plate 507 of the capacitor module 500, the negative electrode-side conductor plate 704 (refer to FIG. 20), which is connected with the negative conductor plate 505 of the capacitor module 500, and an insulation sheet 7000 disposed between the conductor plates 702 and 704. Wire lengths of the conductor plates 505 and 507 can be reduced by arranging the conductor plates 505 and 507 to penetrate a water path dividing wall that is formed by the meander of the cooling water path 19 of the cooling jacket 19A, thereby reducing parasitic inductance from the power modules 300 to the capacitor module 500.

The control circuit board 20 and the drive circuit board 22 are arranged above the laminated conductor plate 700. The driver circuit 174, shown in FIG. 2, is mounted on the drive circuit board 22, and the control circuit 172 which includes a CPU shown in FIG. 2 is mounted on the control circuit board 20. In addition, a metal base plate 11 is disposed between the drive circuit board 22 and the control circuit board 20. The metal base plate 11 has a function of an electromagnetic shield for a group of circuits mounted on the both boards 22 and 20 and dissipates the heat generated at the drive circuit board 22 and the control circuit board 20 to cool them. Thus, the power converter device can be efficiently cooled in a small space and the whole power converter device can be reduced in size by providing the cooling jacket 19A in the middle of the housing 12, arranging the power modules 300 for driving the motor generators 192 and 194 on one side of the cooling jacket, and arranging the inverter device (power module) 43 for auxiliaries on the other side. Integrally producing the cooling jacket 19A with the housing 12 with aluminium casting has an effect to increase cooling effect and mechanical strength of the cooling jacket 19A. Since the housing 12 and the cooling jacket 19A have an integrally molded structure with aluminium casting, thermal conductivity is improved, thereby improving cooling efficiency for the drive circuit board 22, the control circuit board 20, and the capacitor module 500, which are positioned far from the cooling jacket 19A.

A flexible wiring 23, which passes through the metal base plate 11 to connect the group of circuits of each of the circuit boards 20 and 22, is provided on the drive circuit board 22 and the control circuit board 20. The flexible wiring 23 has a structure in which the flexible wiring is laminated in the wiring board in advance and fixed with a jointing material such as a solder to a wiring pattern on the top of the wiring board. An electrode of the flexible wiring 23 is penetrated in a through-hole provided in advance in the wiring board and is fixed with a jointing material such as a solder. A switching timing signal of the inverter circuit is transmitted from the control circuit board 20 to the drive circuit board 22 through the flexible wiring 23, and the drive circuit board 22 generates a gate drive signal and applies it to each gate electrode of the power modules. The use of the flexible wiring 23 thus allows a head of a conventionally used connector to be unnecessary, packaging efficiency of the wiring board to be improved, and the number of components to be reduced, thereby achieving inverters reduced in size. The control circuit board 20 is connected to the connector 21 that performs external electrical connection. The connector 21 is used to transmit signals with the vehicle-mounted battery 136 provided outside the power converter device, i.e., a lithium battery module. Signals that indicate the state of battery, the state of charge of the lithium battery, and the like are sent from the lithium battery module to the control circuit board 20.

Openings are formed at the upper end and the lower end of the housing 12. Those openings are covered by fixing each of the upper case 10 and the lower case 16 to the housing 12 with fastener components such as screws or bolts. The cooling jacket 19A, in which cooling water flow path 19 is provided, is formed in a substantially middle of the height direction of the housing 12. An upper surface opening of the cooling jacket 19A is covered with each of the power modules 300 and a lower surface opening of the cooling jacket is converted with the lower water path back cover 420 so as to form the cooling water flow path 19 inside the cooling jacket 19A. A water leak test for the cooling water flow path 19 is conducted in the middle of assembly. Then, after passing the water leak test, boards and the capacitor module 500 are mounted through the upper and lower openings of the housing 12. Thus, it is arranged that the cooling jacket 19A is disposed in the middle of the housing 12 and then necessary components are fixed through the openings of the upper end and the lower end of the housing 12, thereby improving productivity. In addition, it is possible that the cooling water flow path 19 is completed first and, after a water leak test, other components are attached, thereby improving both productivity and reliability.

Figure 5:
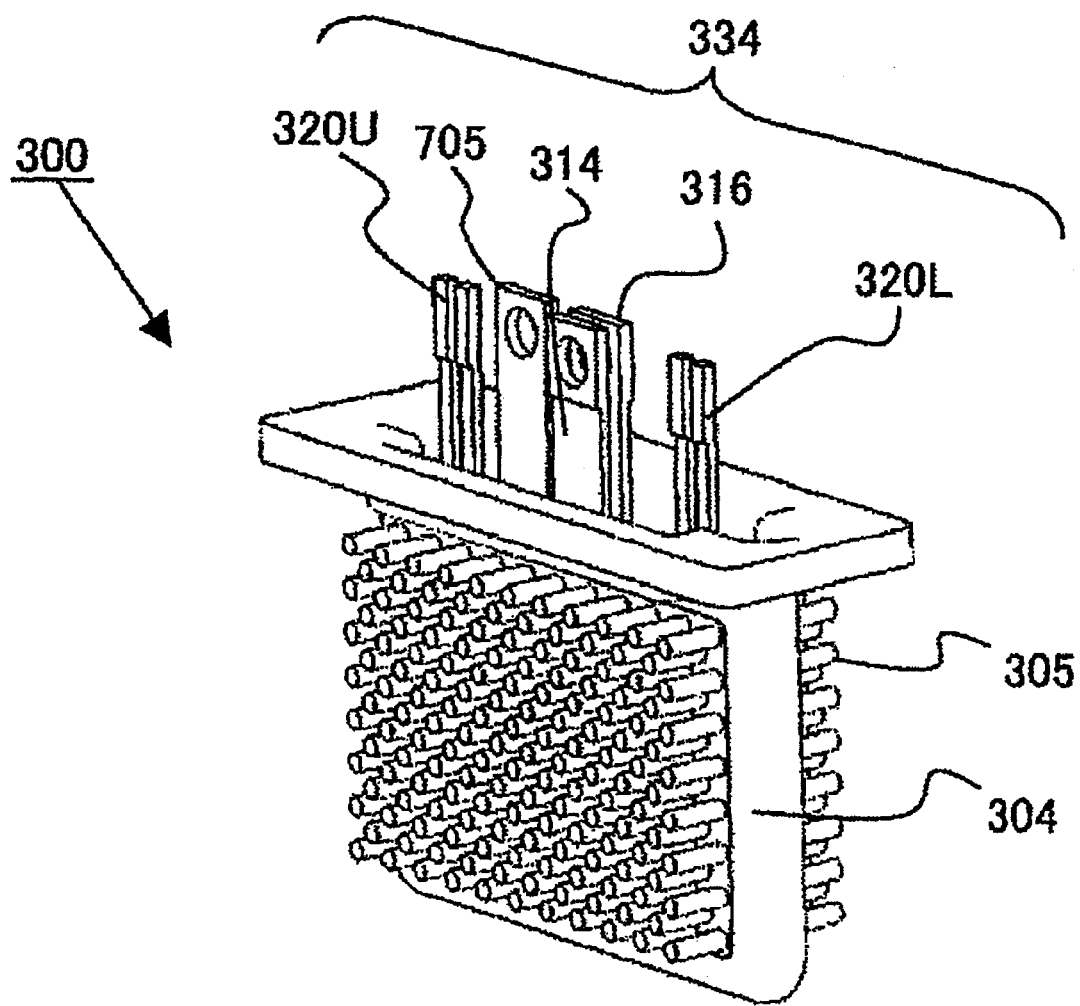
FIG. 5 is a perspective view of the first power module according to an embodiment of the present invention.

In FIG. 5, the reference numeral 304 represents the seamless CAN-like heat dissipating base, which has the exterior wall formed of the same material as the heat dissipating bases facing each other and covering the periphery of the heat dissipating bases. The opening is provided on the part of the exterior wall, and the power semiconductors are housed in the opening. The reference numeral 314 represents the DC positive electrode wiring board connection section, the reference numeral 316 represents the DC negative electrode wiring board connection section, and the reference numerals 320U and 320L represent control terminals of the power module.

Figure 6:
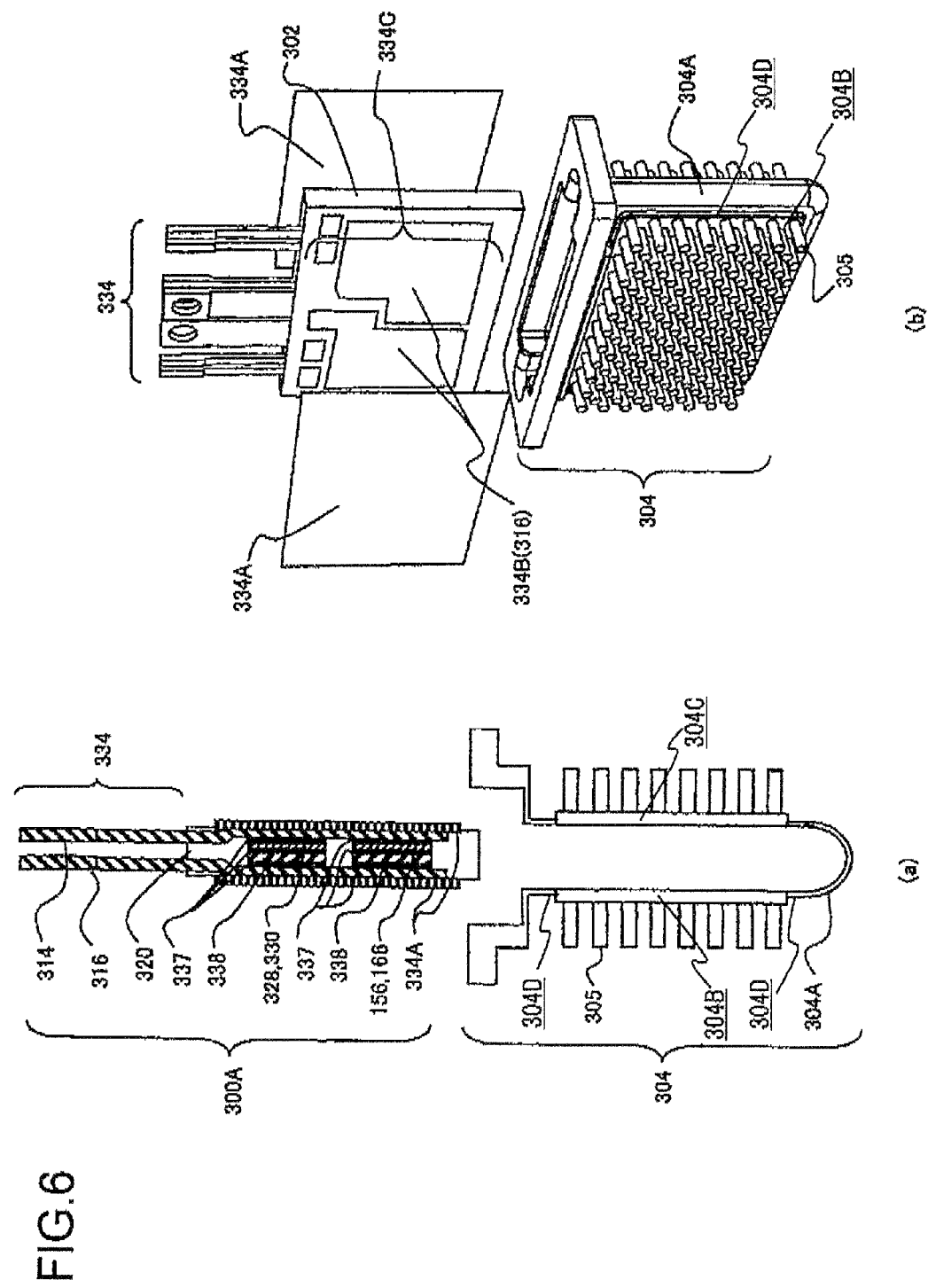
FIG. 6(a) is a sectional view of a resin molded type double-sided electrode module, which is a component of the power module according to the present embodiment.
FIG. 6(b) is a perspective view of the resin molded type double-sided electrode module.

The power module 300 of the present embodiment is constituted with the seamless CAN-like heat dissipating base 304 formed of metal materials such as Cu, Al, AlSiC, Cu—C, and Al—C, and a double-sided electrode module 300A in which an electrical wiring board 334 formed from the external connection terminals 314, 316, 320U, and 320L and the power semiconductors are molded with a resin material 302 (refer to FIG. 6 (*a*)), and includes an AC terminal 705 of the U, V, or W phase for connecting with the motor which is a load.

The power module 300 of the present embodiment is characterized in that the double-sided electrode module 300A, which is an electrical component with less water resistance, is built in to the seamless CAN-like heat dissipating base 304, which directly contacts the cooling medium. This prevents the cooling medium such as water or oil not from directly contacting the double-sided electrode module 300A. The seamless CAN-like heat dissipating base 304, free from seams of metal and adhesive materials such as a resin, is used for the structure of the heat dissipating base, thereby preventing the cooling medium from penetrating and flowing into through the heat dissipating base side and allowing the power semiconductors to be highly reliable. In the case of failure in the power semiconductors, reliability reduction in the power converter device that results from water leak due to secondary failure in the heat dissipating base can be prevented, thereby providing a highly reliable power converter device.

Figure 7:
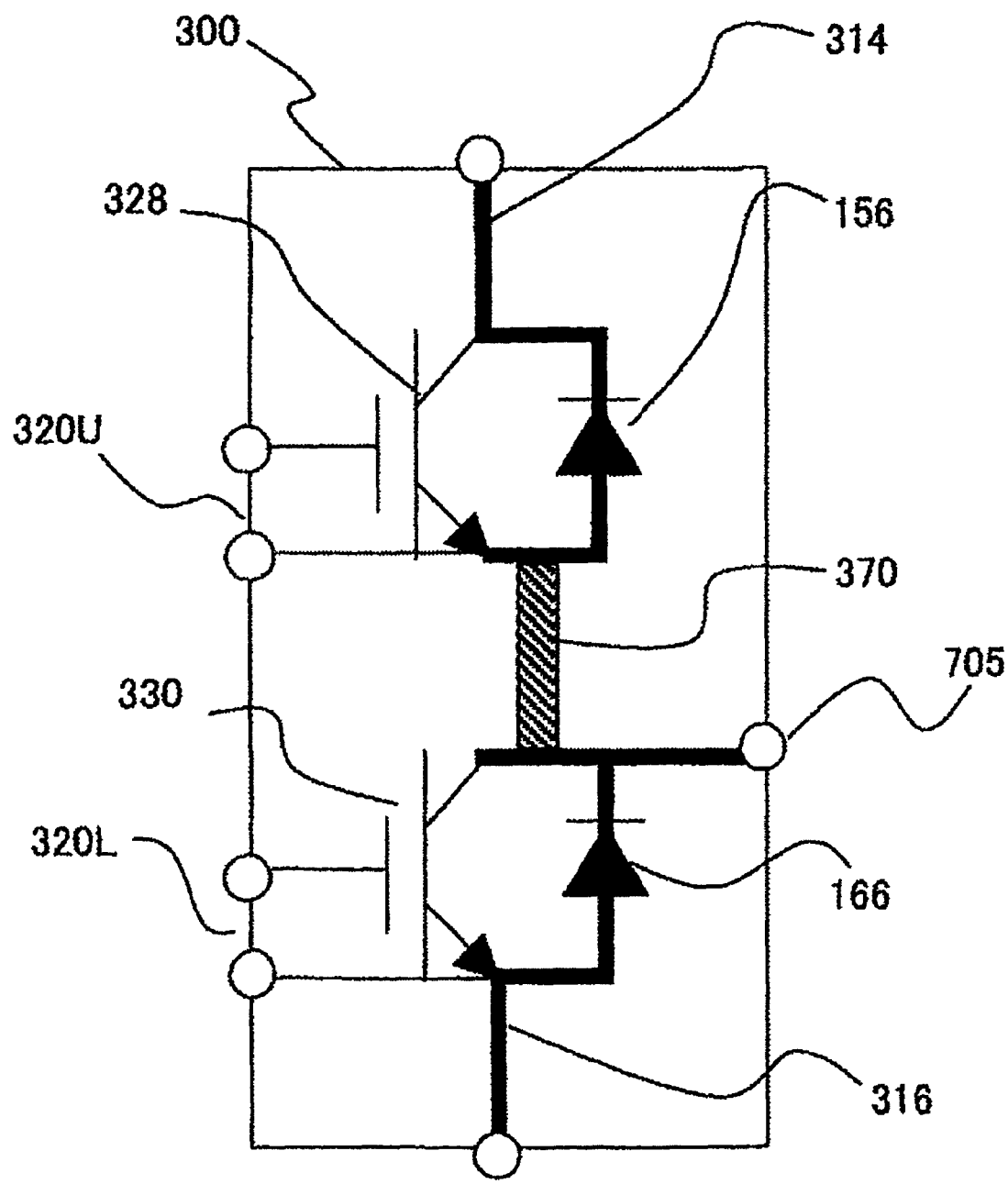
FIG. 7 is a diagram showing an internal circuit configuration of the power module.

FIG. 6 (*a*) is a sectional view of the resin molded type double-sided electrode module 300A, which is a component of the power module 300, and FIG. 6 (*b*) is a perspective view of the resin molded type double-sided electrode module 300A. In FIG. 6 (*a*), the IGBTs 328 and 330, the diodes 156 and 166, and the like of the upper and lower arms are arranged between a pair of the electrical wiring boards 334 in the double-sided electrode module 300A. The collector sides of the IGBTs 328 and 330 are fixed to the DC positive electrode wiring board 314 through a metal jointing material 337 such as a soldering material or a silver sheet, and a heat spreader plate 338 is fixed with the metal jointing material 337 to the emitter sides of the IGBTs 328 and 330. The heat spreader plate 338 is fixed with the metal jointing material 337 to the DC negative electrode wiring board 316. FIG. 7 shows the circuit configuration for one phase of the inverter circuit built in the power module 300. A wiring layout of the electrical wiring board 334 is prepared so that the inverter circuit for one phase can be constituted with the IGBTs 328 and 330 and the diodes 156 and 166, and the upper and lower arms are connected with an upper and lower arms wiring board 370 that connects the DC positive electrode wiring board 314 with the DC negative electrode wiring board 316. It is to be noted that the circuits for the three phases that constitute the inverter circuit may be built in to the power module 300, and alternatively, a circuit only for the upper arm of one phase may be built in to the power module 300. As shown in FIG. 6 (*a*), the IGBTs 328 and 330 and the diodes 156 and 166 of the upper and lower arms are sandwiched with each of the electrical wiring boards 334 and integrated with the resin material 302. Heat dissipation surfaces 334B of both of the electrical wiring boards 334 in the vicinity of the power semiconductors are exposed through a part of the resin material 302, a flat surface 334C is formed from the heat dissipation surfaces 334B and the resin material 302, and an adhesive insulation layer 334A is formed on each of the formed surfaces 334C, thereby improving insulation properties and thermal conductivity. The electrical wiring boards 334 may be made of Cu and Al. The adhesive insulation layer 334A may be a thin insulation sheet made from a mixture of an epoxy resin and a thermally conductive filler. Thickness can be accurately determined on the sheet-like insulation layer compared with grease, adhesive materials, or the like, and, in addition, void formation can be reduced, thereby significantly reducing fluctuations in thermal resistance and insulation properties. The insulation layer may be a ceramic plate or an adhesive board on which an adhesive material is applied to both sides of a ceramic plate. The adhesive insulation layers 334A and the CAN-like heat dissipating base 304 are adhered so as to form a heat dissipation route with excellent heat dissipation from both sides of the power semiconductors.

The resin molded type double-sided electrode module 300A that is built in to the power module 300 of the present embodiment is characterized by including a connection structure in which the heat dissipation surfaces 334B of both of the electrical wiring boards 334 are fixed to an inner side wall of the seamless CAN-like heat dissipating base 304 through the adhesive insulation layers 334A. In this manner, the resin molded type double-sided electrode modules 300A, which are power semiconductor peripheries, can be individually formed, and operation verification of the power semiconductors and inspection of the connection of the power semiconductors and the electrical wiring boards 334 can be conducted not through the heat dissipating base, thereby allowing the power semiconductors to be highly reliable and thus allowing the power converter device to be highly reliable.

In addition, in other words, the CAN-like heat dissipating base 304 of the present embodiment is a cylindrical case with a bottom which has an opening on one side. Then, the double-sided electrode module 300A, which constitutes the semiconductor circuit unit, is housed in a housing region formed in the CAN-like heat dissipating base 304. The insulation layer 334A, which is an insulating member, is included so as to ensure electrical insulation between the inner walls of the CAN-like heat dissipating base 304 and the double-sided electrode module 300A. The double-sided electrode module 300A is sandwiched and supported by the inner walls of the CAN-like heat dissipating base 304. In addition, the insulation layers 334A are placed between the inner walls of the CAN-like heat dissipating base 304 and the double-sided electrode module 300A, and, by thermal processing as described later, are formed of a material that improves adhesion properties of the double-sided electrode module 300A and the inner walls of the CAN-like heat dissipating base 304.

In the above manner, the insulation properties of the double-sided electrode module 300A and the inner walls of the CAN-like heat dissipating base can be secured. In addition, adhesion properties of the double-sided electrode module 300A and the inner walls of the CAN-like heat dissipating base are improved so as to inhibit separation from occurring between the double-sided electrode module 300A and the inner walls of the CAN-like heat dissipating base and so as not to reduce thermal conductance in the heat transfer path from the double-sided electrode module 300A to the CAN-like heat dissipating base.

In addition, in other words, two base plates 304B and 304C that form the heat dissipation surfaces are arranged to face each other in the CAN-like heat dissipating base 304 of the present embodiment, and they are connected via an outer circumference curved portion 304A. In other words, the outer circumference curved portion 304A works as a connecting member of the two base plates 304B and 304C. The connecting member includes a circumference section 304D that surrounds an outer circumference of one of the two base plates 304B and 304C. The insulation layers 334A are placed between the inner walls of the housing region formed from the two base plates and the outer circumference curved portion 304A and the double-sided electrode module 300A. Here, the rigidity of the outer circumference curved portion 304A described earlier is set to less than that of the two base plates. Alternatively, the thickness of the outer circumference curved portion 304A described earlier is set to less than that of the two base plates.

As a result, the both sides of the semiconductor circuit unit can be cooled through each of the two base plates 304B and 304C, thereby increasing the heat dissipation area. Since the rigidity of the connecting member is set to less than that of the base plate, by applying pressure to the two base plates 304B and 304C as they sandwich the semiconductor circuit unit, the power module case can be formed with ease, and the semiconductor circuit unit, the insulating member, and the base plate 304B and 304C are connected so that the heat transfer path, through which heat can be exchanged with one another, can be formed with ease.

It is to be noted that although in the present embodiment, the outer circumference curved portion 304A, which works as a connecting member of the two base plates 304B and 304C, is formed integrally with the base plate, it may be arranged to join the two base plates 304B and 304C as a separate member by welding or the like. Also in that case, the rigidity or the thickness of the outer circumference curved portion 304A is set to less than that of the two base plates 304B and 304C.

Figure 8:
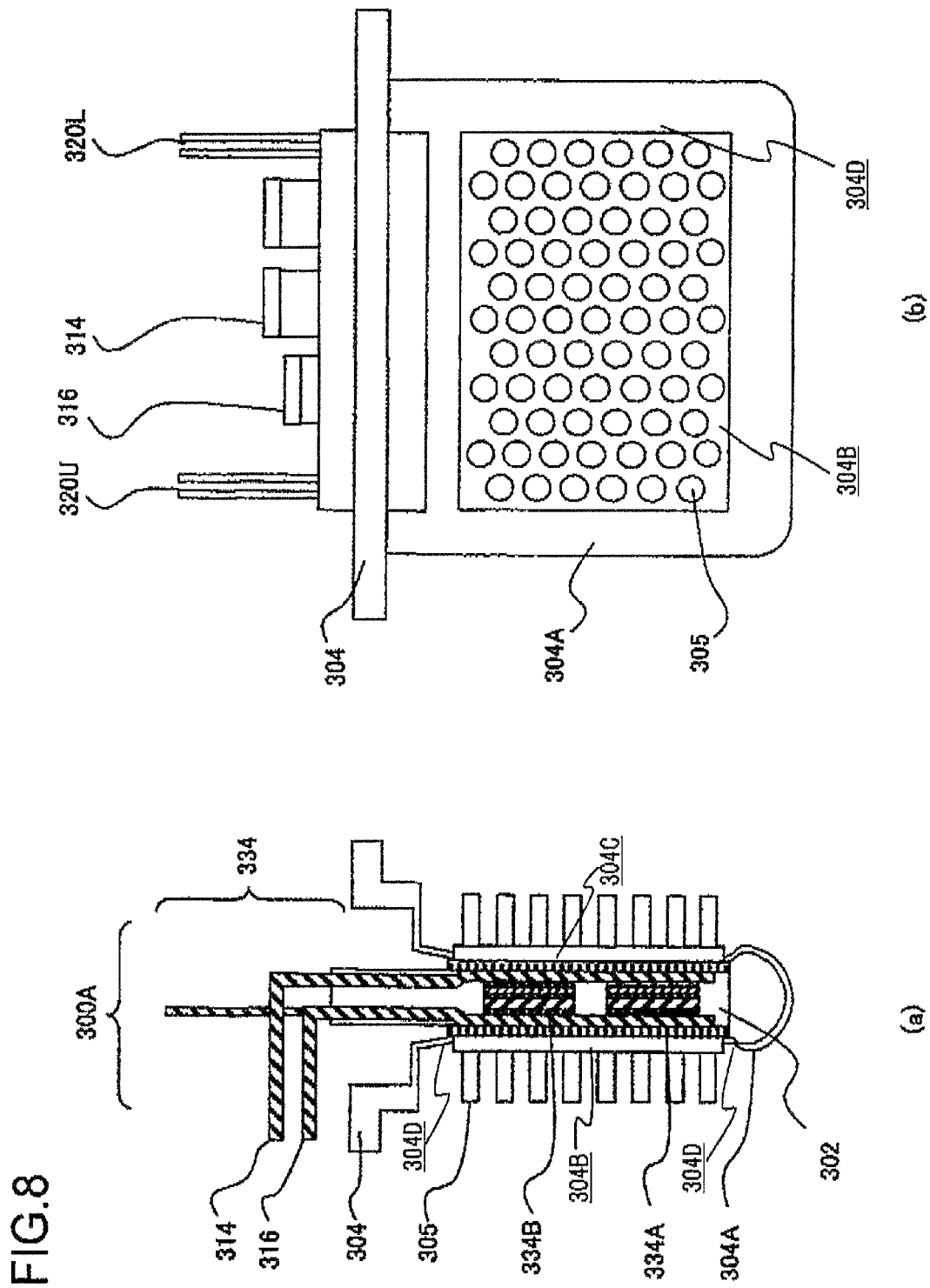
FIG. 8(a) is a sectional view of the power module and FIG. 8(b) is a side view the power module.

FIG. 8 (*a*) shows a sectional view of the power module 300 and FIG. 8 (*b*) shows a side view of the power module 300. In FIG. 8 (*a*), the double-sided electrode module 300A is housed in the seamless CAN-like heat dissipating base 304, fixed in the CAN-like heat dissipating base 304 with the adhesive insulation layer 334A, thus constituting an integrated structure. As shown in FIG. 8 (*b*), the pin-like fins 305 are formed on the outer side surface of the CAN-like heat dissipating base 304 opposite to the heat dissipation surfaces 334B of the both electrical wiring boards 334 of the double-sided electrode module 300A, and the pin-like fins 305 are arranged to cover the outer circumference of the CAN-like heat dissipating base 304. The CAN-like heat dissipating base 304 and the pin-like fins 305 are integrally shaped with the same material and alumited all over the surface so as to improve anticorrosive properties and resin adhesive performance of the CAN-like heat dissipating base 304. Each of the fins 305 contacts the cooling medium flowing through the cooling water path so as to enable heat to dissipate from the both side surfaces of the power semiconductor, and the heat transfer route from the power semiconductor to the cooling medium is parallelized so as to allow the thermal resistance to be reduced significantly. As a result, it is possible to reduce the power semiconductor in size and also reduce the power converter device in size.

Figure 9A:
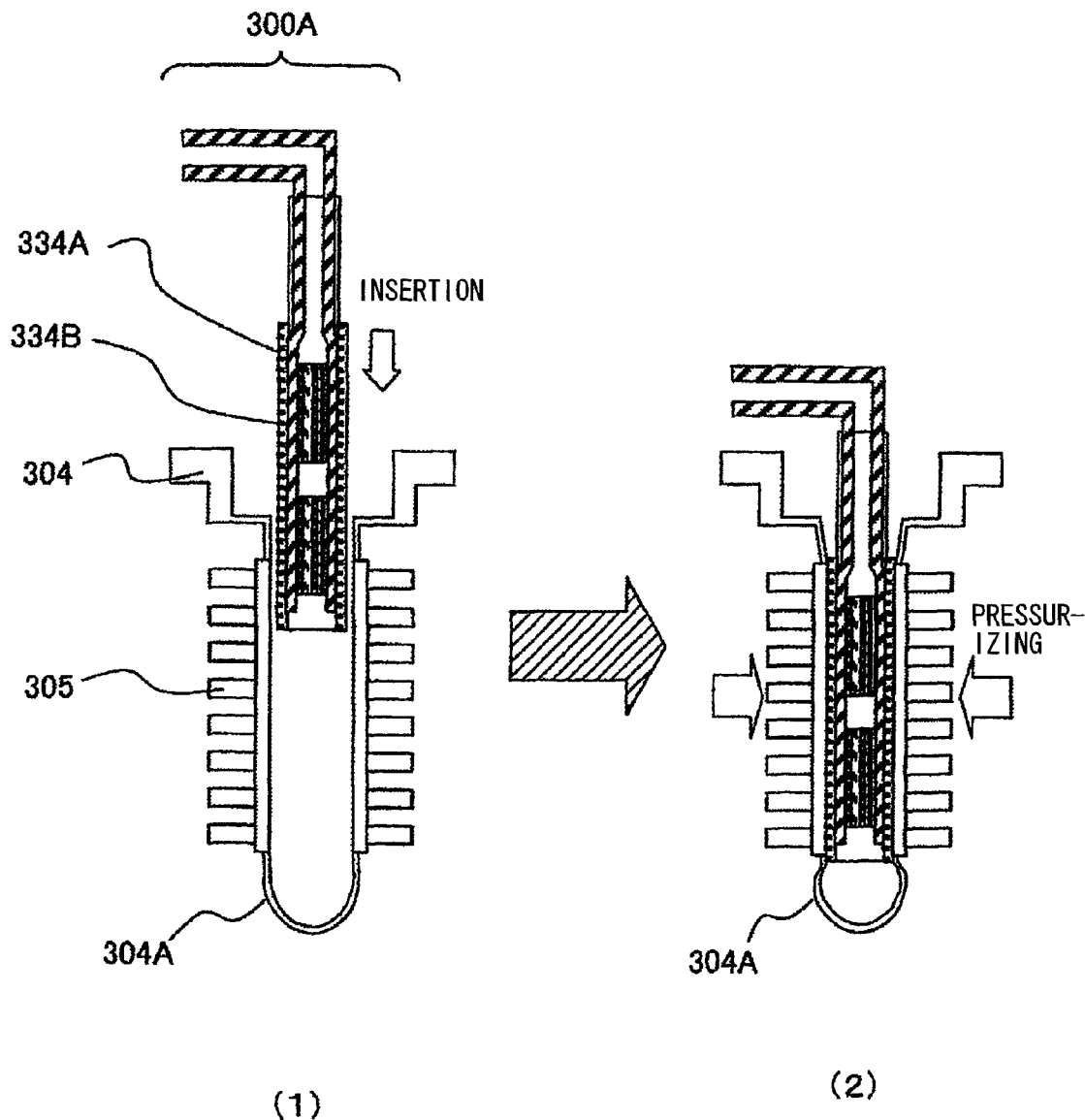
FIG. 9(a) is an illustration of an assembly flow of a CAN-like heat dissipating base and the resin molded type double-sided electrode module.
Figure 9C:
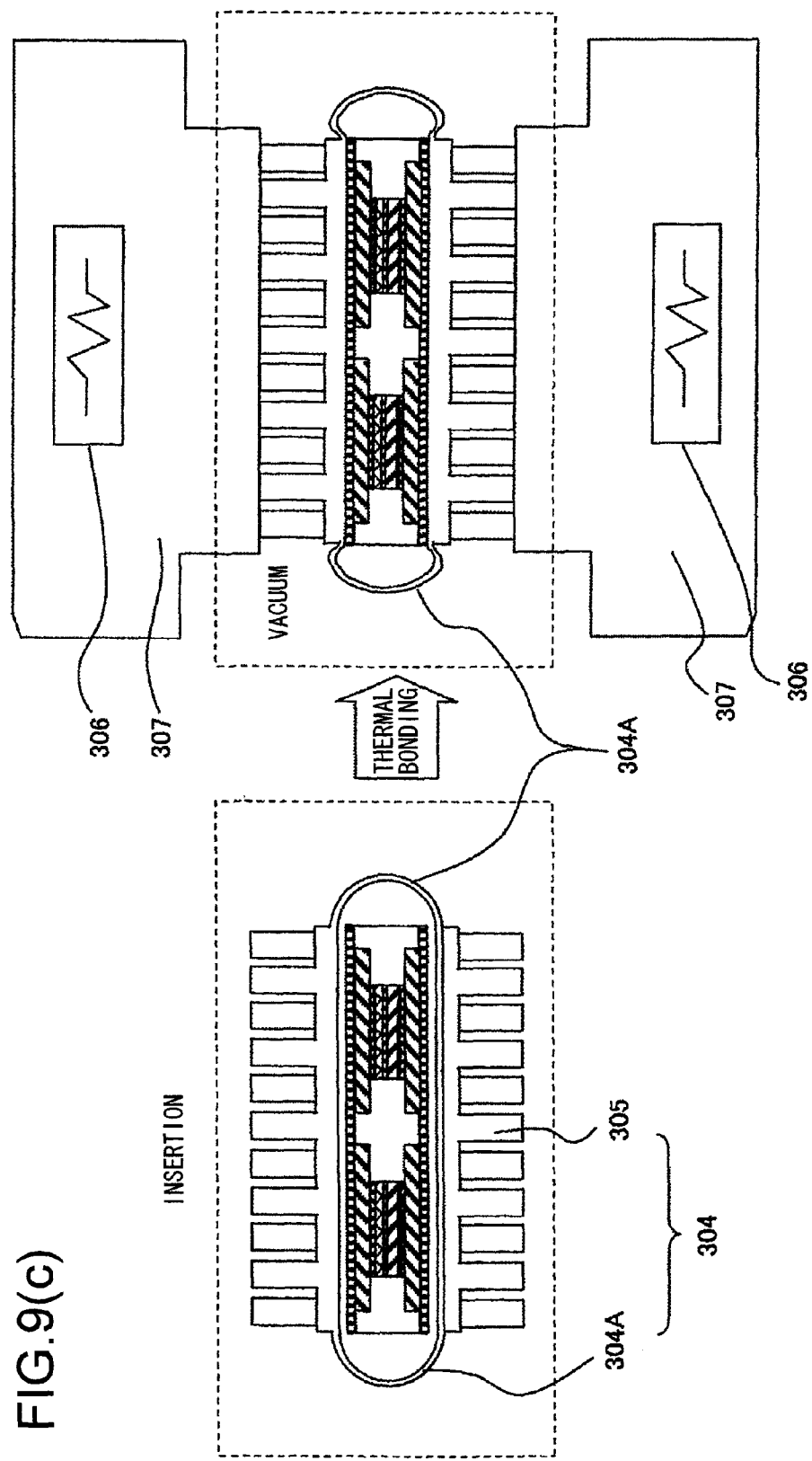
FIG. 9(c) is an illustration of an assembly flow of the CAN-like heat dissipating base and the resin molded type double-sided electrode module.

FIG. 9 (*a*) shows an assembly flow and a sectional view of integration of the CAN-like heat dissipating base 304 and the resin molded type double-sided electrode module 300A. In FIG. 9 (*a*), a structure in which the thickness of the adhesive portion of the CAN-like heat dissipating base 304 that adheres to the heat dissipation surfaces 334B is made thicker than the outer circumference curved portion 304A is adopted in the CAN-like heat dissipating base 304. At first, (1) the double-sided electrode module 300A is placed inside the CAN-like heat dissipating base 304 through the opening.

Next, (2) the double-sided electrode module 300A is pressurized from outside the CAN-like heat dissipating base 304 so that the adhesive insulation layers 334A, which cover the heat dissipation surfaces 334B of the double-sided electrode module 300A, are fixed to the inner walls of the CAN-like heat dissipating base 304, and the outer circumference curved portion 304A of the CAN-like heat dissipating base 304 is deformed. This allows the gap between the adhesive insulation layers 334A and the CAN-like heat dissipating base 304 to be cleared and the CAN-like heat dissipating base 304, which is to be connected with the heat dissipation surfaces 334B, to be adhered and fixed. Heat generated by the power semiconductor is transferred to the CAN-like heat dissipating base 304 through the adhesive insulation layer 334A provided on the both side surfaces of the double-sided electrode module 300A, so that the heat can dissipate from the both sides of the power semiconductor. The heat transfer route from the power semiconductor to the cooling medium is divided into two routes in parallel, so that thermal resistance can be reduced significantly, and hence both the power semiconductor and the power converter device can be reduced in size.

FIG. 9 (b) shows an assembly flow and a sectional view of integrated connection of the double-sided electrode module 300A with the seamless CAN-like heat dissipating base 304. In FIG. 9 (b), a structure in which the thickness of the adhesive portion of the CAN-like heat dissipating base 304 that adheres to the heat dissipation surfaces 334B is made thicker than the outer circumference curved portion 304A is adopted in the CAN-like heat dissipating base 304. At first, (1) the inside of the CAN-like heat dissipating base 304 is deformed so as to expand the inner space by moving in parallel the surfaces of the heat dissipating base to be connected with the heat dissipation surfaces 334B of the double-sided electrode module 300A, and thus the outer circumference curved portion 304A of the CAN-like heat dissipating base 304 is deformed and the opening of the CAN-like heat dissipating base 304 is widened. Next, (2) the double-sided electrode module 300A is inserted in the CAN-like heat dissipating base 304 through the opening. Lastly, (3) the double-sided electrode module 300A is pressurized from outside the CAN-like heat dissipating base 304 so that the adhesive insulation layers 334A, which cover the heat dissipation surfaces 334B of the double-sided electrode module 300A, are fixed to the inner walls of the CAN-like heat dissipating base 304, and the outer circumference curved portion 304A of the CAN-like heat dissipating base 304 is deformed. This allows the gap between the adhesive insulation layer 334A and the CAN-like heat dissipating base 304 to be cleared, the CAN-like heat dissipating base 304 which is to be connected with the heat dissipation surfaces 334B to be adhered to and fixed with the heat dissipation surfaces 334B while minimizing deformation in the heat dissipation fins. Heat generated by the power semiconductor is transferred to the CAN-like heat dissipating base 304 through the adhesive insulation layer 334A provided on the both side surfaces of the double-sided electrode module 300A, so that the heat can dissipate from the both sides of the power semiconductor. The heat transfer route from the power semiconductor to the cooling medium is divided into two routes in parallel, so that thermal resistance can be reduced significantly, and hence both the power semiconductor and the power converter device can be reduced in size.

FIG. 9 (c) is an assembly flow for integrated connection of the double-sided electrode module 300A with the seamless CAN-like heat dissipating base 304, and is a sectional view of FIG. 9 (b). FIG. 9 (c) shows an assembly process to fix the adhesive insulation layers 334A with the inner walls of the CAN-like heat dissipating base 304. The fins 305 of the CAN-like heat dissipating base 304 are pressurized with a pressing machine 307 in which an overheating heater 306 or the like is included so that the heat dissipating base adheres to the adhesive insulation layers. At that time, the double-sided electrode module 300A periphery is vacuumized so as to discharge an air reservoir such as a void occurring on an interface of the adhesive insulation layer 334A. In addition, by burning at a high temperature for a few hours, hardening of the adhesive material can be facilitated. Since those result in improved reliability of an insulation life and the like of the insulation layer 334A, a small-sized, highly-reliable power converter device can be provided.

It is desirable for the insulation layer 334A to have adhesion properties when the inner side wall of the CAN-like heat dissipating base 304 and the double-sided electrode module 300A are joined by being pressurized from side walls on both sides of the power module 300 as the power module 300 according to the present embodiment. It is also desirable for the insulation layer 334A to be formed of a material which thermally cures upon change in temperature caused by the overheating heater 306 described earlier. This allows the CAN-like heat dissipating base 304 to undergo the forming process by the pressing machine 307 and the adhesion process by the insulation layer 334A simultaneously or rapidly.

The insulation layer 334A that is preferable for the power module 300 according to the present embodiment will now be explained. The insulation layer 334A according to the present embodiment is required to secure electrical insulation properties and adhesion properties between the inner side wall of the CAN-like heat dissipating base 304 and the double-sided electrode module 300A. However, the heat dissipation surfaces 334B of the double-sided electrode module 300A is formed of electrical wiring, the resin material 302, and the like as shown in FIG. 6 (b). Therefore, irregularity occurs at a boundary between the electrical wiring and the resin material 302, and adhesion properties with the insulation layer 334A may be reduced. As a result, air or the like intrudes between the insulation layer 334A and the double-sided electrode module 300A, and thus the heat transfer rate of the power module 300 may be greatly reduced.

It is hence desirable to form the insulation layer 334A with an insulating material that is flexible, i.e., with low Young's modulus, so as to fill in irregularity at the boundary between the electrical wiring and the resin material 302.

On the other hand, as the insulating material with low Young's modulus contains many impurities that are different from those for securing the electrical insulation properties, electrical insulation properties may not be sufficiently secured. Therefore, the insulation layer 334A according to the present embodiment further includes an insulating material with less impurities, i.e., high Young's modulus, between the insulating material with low Young's modulus described earlier and the inner side wall of the CAN-like heat dissipating base 304. In other words, the insulation layer 334A constitutes a multilayer configuration with insulating materials having different Young's moduli. This allows reduction in the heat transfer rate to be inhibited and the electrical insulation properties to be secured.

Furthermore, the inner side wall of the CAN-like heat dissipating base 304 is required to constitute an irregular configuration due to the reason described later referring to FIG. 12. In this case, the insulating material with low Young's modulus described earlier is provided on the side toward the inner wall of the CAN-like heat dissipating base 304 so as to inhibit reduction in the heat transfer rate between the inner side wall of the CAN-like heat dissipating base 304 and the insulation layer 334A. More specifically, the insulation layer 334A is formed of the insulating material with low Young's modulus in the upper layer and the lower layer and the insulating material with high Young's modulus in the middle layer. This allows reduction in the heat transfer rate to be inhibited and the electrical insulation properties to be secured even in the case of an embodiment such as in FIG. 12.

FIGS. 10 (a) to (c) are illustrations of the aluminium cast of the housing 12 including the cooling jacket 19A to which the cooling water inlet pipe and the outlet pipe are attached. FIG. 10 (a) is a perspective view of the cooling jacket 19A, FIG. 10 (b) is a top view of the housing 12, and FIG. 10 (c) is a sectional view of the housing 12. As shown in FIGS. 10 (a) to (c), the cooling jacket 19A, in which the cooling water flow path 19 is formed, is integrally casted in the housing 12. The cooling water inlet pipe 13, through which cooling water is taken in and the cooling water outlet pipe 14 are provided on one of the side surfaces of the short side of the housing 12, whose plan shape is substantially rectangular.

In FIG. 10 (a), the cooling water flows into the cooling water flow path 19 through the cooling water inlet pipe 13, and is divided into two and flows along the long side of the rectangle, which is the direction of an arrow 418. The cooling water returns as indicated by an arrow 421a at a corner portion 19C in the vicinity of the other side surface of the short side of the rectangle, and is divided into two and flows in the direction of an arrow 422 along the long side of the rectangle again. The cooling water further flows along the long side of the rectangle, turns around as indicated by an arrow 421b, flows into the outlet pipe provided on the lower cooling water path cover 420, returns, and flows out to the cooling water outlet pipe 14 through an outlet hole (refer to FIG. 10 (b)). There are six of the openings 400 bored on the upper surface of the cooling jacket 19A. The CAN-like heat dissipating base 304 of each of the power modules 300 protrudes into the flow of the cooling water through each of the openings. Pressure loss can be reduced by dividing the cooling water into two with the CAN-like heat dissipating base 304 and column-like flow dividing boundaries 19B of the cooling jacket 19A. The cooling water is divided into two also by configuring the outer circumference curved portion 304A of the CAN-like heat dissipating base 304 into a curved surface, thereby resulting in reduction in pressure loss. In addition, rise of pressure loss can be reduced also by causing the flow path to meander in S shape so as to cool six power modules arrayed in series, thereby improving cooling efficiency. Each of the power modules 300 is fixed so as to cover the openings of the cooling jacket 19A in a watertight manner through a sealing material such as the liquid seal 800.

In FIG. 10 (b), the cooling jacket 19A is formed integrally with the housing 12 across the middle portion of a housing peripheral wall 12W. The six openings 400 and 402 are provided on the upper surface of the cooling jacket 19A and the one opening 404 is provided on the lower surface thereof. A power module mounting surface 410S is provided on the periphery of each of the openings 400 and 402. Threaded holes 412 are threaded holes for fixing to the cooling jacket 19A a module fixture 304C for pressing the power module to the mounting surface 410S (refer to FIG. 11). A plurality of power modules 300 can be pressed to the cooling jacket 19A with the module fixture 304C. This results in reduction in the number of screws that apply pressure to and fix the power module 300 to the cooling jacket, thereby improving assemblability. Furthermore, the cooling jacket 19A can be reduced in size and a flange of the CAN-like heat dissipating base 304 of the power module can be reduced in size, the cooling jacket 19A, the housing 12, and the power module 300 can be reduced in size, thereby contributing greatly to reduction in size of the power converter device 200. The power semiconductors built in to the power module 300 can be cooled from the both sides with the divided cooling water, thereby having an advantage of reduction in thermal resistance. Pedestals 304D, with which the control circuits 20 and 21 and the heat dissipating base 11 are fixed, are provided on the module fixture 304C.

The cooling jacket 19A includes a dividing wall portion for forming the cooling water flow path 19. A plurality of through holes 406 are formed in the dividing wall portion on the side portion of each of the power modules 300. More specifically, two of the through holes 406 that correspond to the U phase are formed on the dividing wall portion between the power modules 300 that constitute the U phase and the exterior wall of the housing 12. Two of the through holes 406 that correspond to the V phase are formed on the dividing wall portion between the power modules 300 that constitute the U phase and the power modules 300 that constitute the V phase. Two of the through holes 406 that correspond to the W phase are formed on the dividing wall portion between the power modules 300 that constitute the V phase and the power modules 300 that constitute the W phase. As shown in FIG. 4, the capacitor module 500 is arranged below the power modules 300. On the other hand, the DC terminal of the power module 300 protrudes upward the power module 300. Each of the positive conductor plate 507 and the negative conductor plate 505 extending from the capacitor module 500 protrude through each of the through holes 406 so as to be connected with the DC terminal of the power module 300. As a result, since the balance of wiring distance for each of the phases from the capacitor module 500 to the power module 300 can be adjusted, the balance of wiring inductance can be uniformed as much as possible for each of the phases. Moreover, since each of the through hole 406 is formed on the side portion of each of the power modules 300 and the direction of protrusion of the positive conductor plate 507 and the negative conductor plate 505 through the through hole 406 becomes the same as the direction of protrusion of the DC terminal of the power module 300, the distance required to connect the DC terminal of the power module 300 with the positive conductor plate 507 and the negative conductor plate 505 becomes short and since the connection becomes easy so that the wiring inductance can be reduced.

Figure 11:
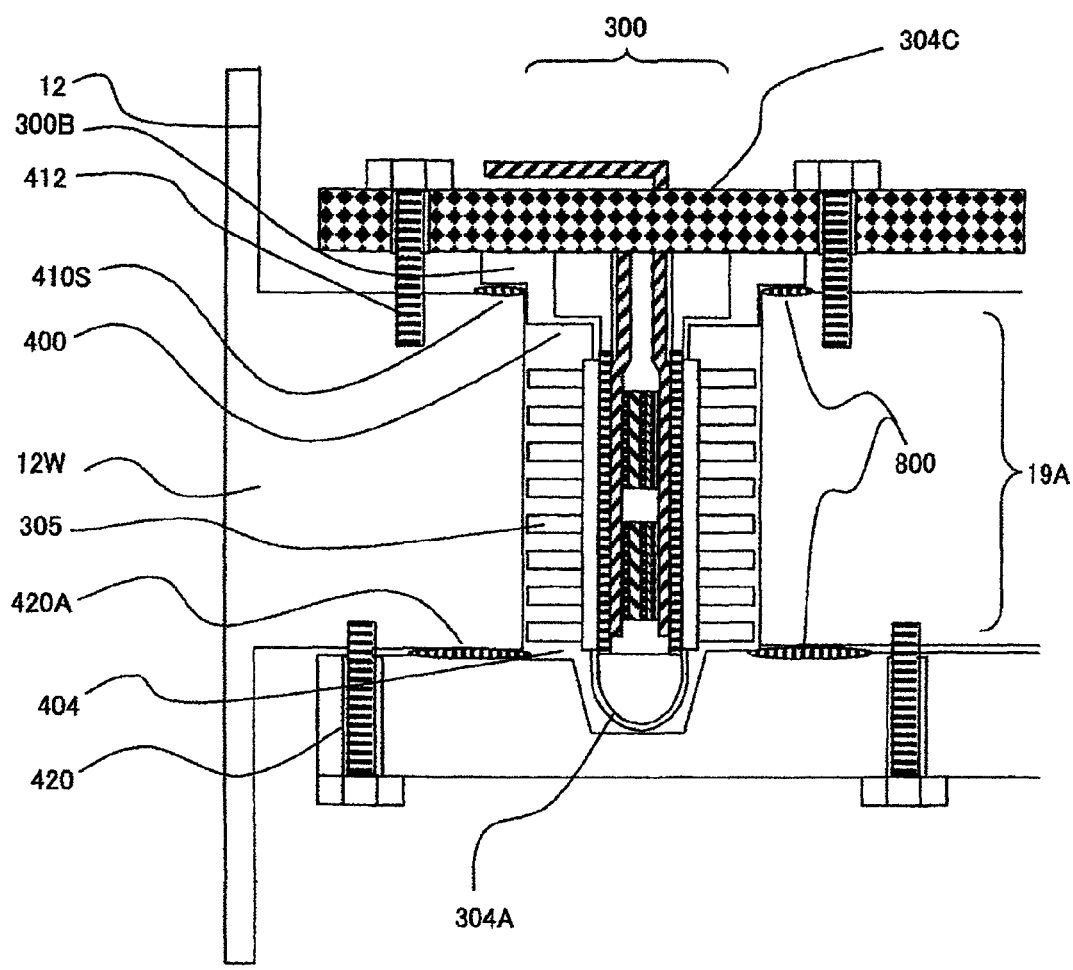
FIG. 11 is a seal structure diagram of a cooling jacket and the power module of the power converter device according to an embodiment of the present invention.

FIG. 11 is a sectional view showing a seal section of the power module 300 and the cooling jacket 19A according to the present embodiment.

In FIG. 11, the cooling jacket 19A is formed integrally with the housing 12 across the middle portion of the housing peripheral wall 12W, and the opening 400 is provided on the upper surface of the cooling jacket 19A and the opening 404 of the cooling water path is provided on the lower surface thereof. The power module mounting surface 410S is provided on the periphery of the opening 400. An engagement section 420A for engagement with the lower cooling water path cover 420, is provided on the periphery of the opening 404 and sealed with the liquid seal material 800. The threaded holes 412 are screw holes for fixing to the cooling jacket 19A the module fixture 304C for pressing a flange 300B of the power module 300 to the mounting surface 410S. Since the plurality of power modules 300 can be pressed to the cooling jacket 19A with the module fixture 304C, the liquid seal material applied in advance between the mounting surface 410S and the flange 300B of the power module 300 is crushed and the power modules 300 are pressurized, thereby inhibiting the cooling medium from leaking through between the mounting surface 410S and the power module 300. The number of screws that apply pressure to the power module 300 and fix the power module 300 to the cooling jacket 19A can be reduced, and hence assemblability can be improved. Since the cooling jacket 19A can be reduced in size and the flange 300B of the CAN-like heat dissipating base 304 of the power module 300 can be reduced in size, the cooling jacket 19A, the housing 12, and the power module 300 can be reduced in size, thereby contributing greatly to reduction in size of the power converter device 200. The power semiconductors built in to the power module 300 can be cooled from the both sides with the divided cooling water, thereby having an advantage of reduction in thermal resistance. It is to be noted that a rubber O-ring or the like have a similar effect as a liquid seal material.

Figure 12:
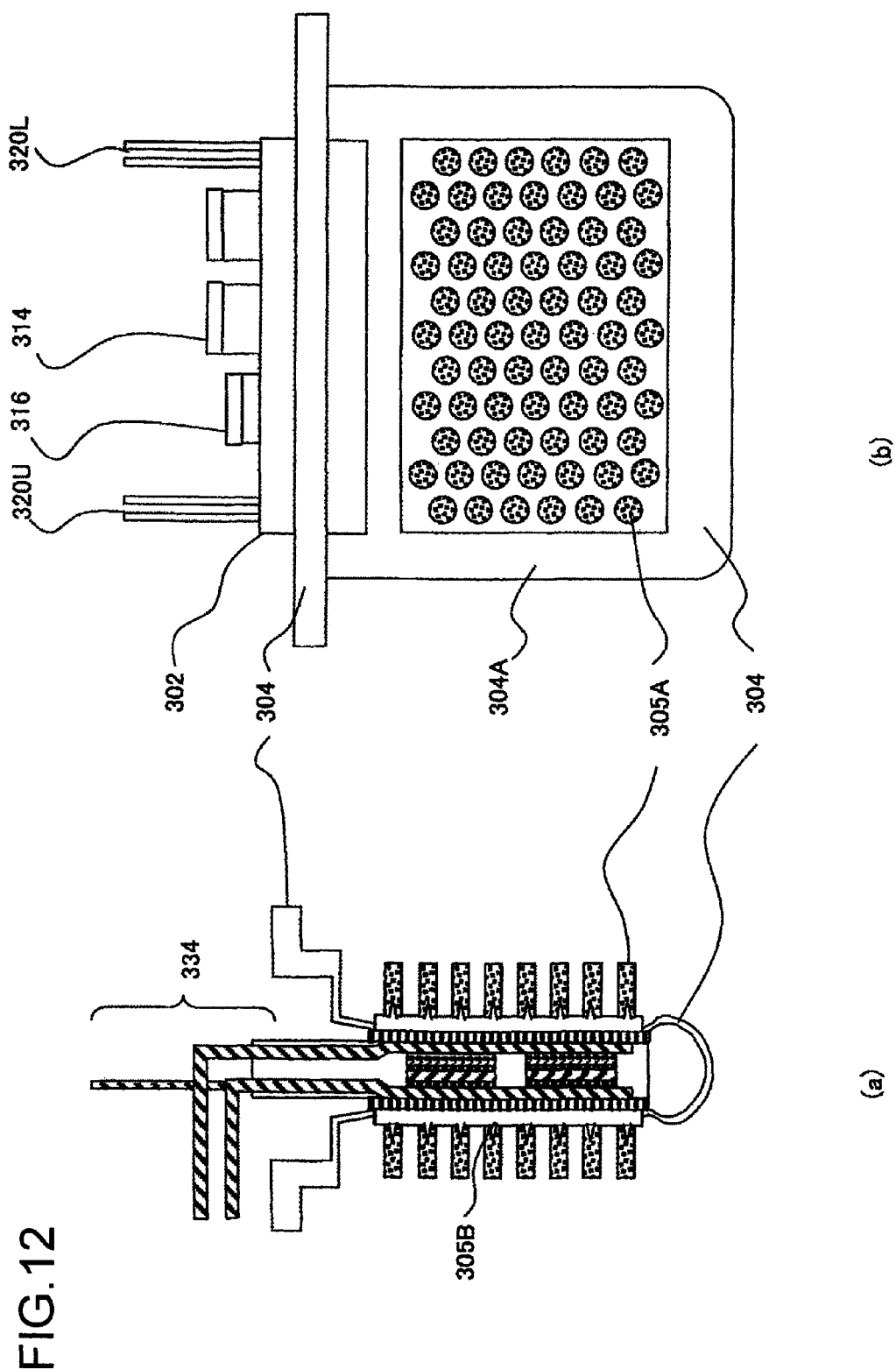

FIG. 12 (a) is a sectional view of a second power module 300 according to the present embodiment, and FIG. 12 (b) is a side view of the second power module 300.

The differences from the above embodiment are as follows. That is, the fins 305 provided on the cooling surface outside the CAN-like heat dissipating base 304 are not formed of a homogeneous material at the same time when the CAN-like heat dissipating base 304 is formed but formed by bonding afterward resin fins 305A, which are excellent in thermal conductivity, to outside the CAN-like heat dissipating base 304. Moreover, irregularities 305B are provided on the surface of the CAN-like heat dissipating base 304 so as to prevent the resin fins 305A from dropping and the irregularities 305B and the resin fins 305A are mechanically engaged.

According to the present embodiment, since the fins 305 can be formed separately, the CAN-like heat dissipating base 304 can be formed as if drink cans are formed, thereby improving productivity. The irregularities 305B are provided so as to improve adhesive properties of the resin fins 305A and the CAN-like heat dissipating base 304, and thus reduction in reliability such as dropping can be prevented. As an area for heat transfer of the resin fins 305A and the CAN-like heat dissipating base 304 can be increased, reduction in thermal resistance of the power module 300 can be achieved, thereby allowing the power module and the power converter device to be reduced in size.

Figure 13:
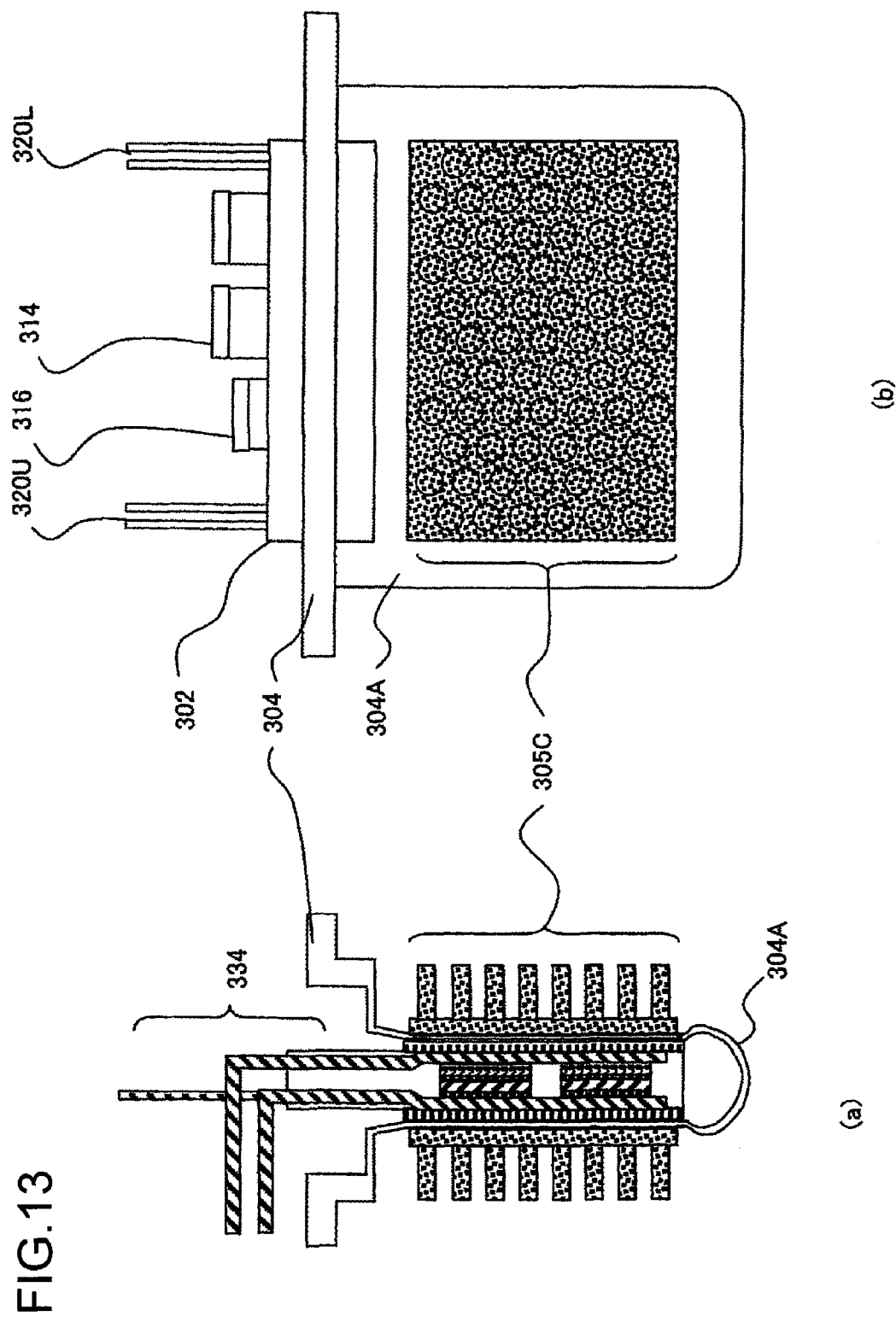
FIG. 13(a) is a sectional view of the third power module according to an embodiment of the present invention and FIG. 13(b) is a side view of the third power module.

FIG. 13 (a) is a sectional view of a third power module 300 according to the present embodiment, FIG. 13 (b) is a side view of the third power module 300.

The difference from the above embodiments lies in that the fins 305 provided on the cooling surface outside the CAN-like heat dissipating base 304 are not formed of a homogeneous material at the same time when the CAN-like heat dissipating base 304 is formed but provided afterward on the CAN-like heat dissipating base 304 by fixing the plate-like fin base 305C on which the plurality of fins 305 are formed in advance to the outside the CAN-like heat dissipating base 304 with a metal contact material such as a braze material or a resin adhesive material.

According to the present embodiment, since the fins 305 can be formed separately, the CAN-like heat dissipating base 304 can be formed as if drink cans are formed, thereby improving productivity. In addition, since the fin base 305C may be formed of metal such as Cu, Al, AlSiC, Cu—C, or Al—C, produced by a method such as forging, or may be formed of an organic material such as a high thermal conductivity resin, the fins 305 can be shaped into a concentric pin shape, ellipse, or the like. Since this allows the surface area of the fins 305 to be increased, an area for heat transfer can be increased, thereby achieving reduction in thermal resistance of the power module 300. As a result, the power module and the power converter device can be reduced in size.

Figure 14:
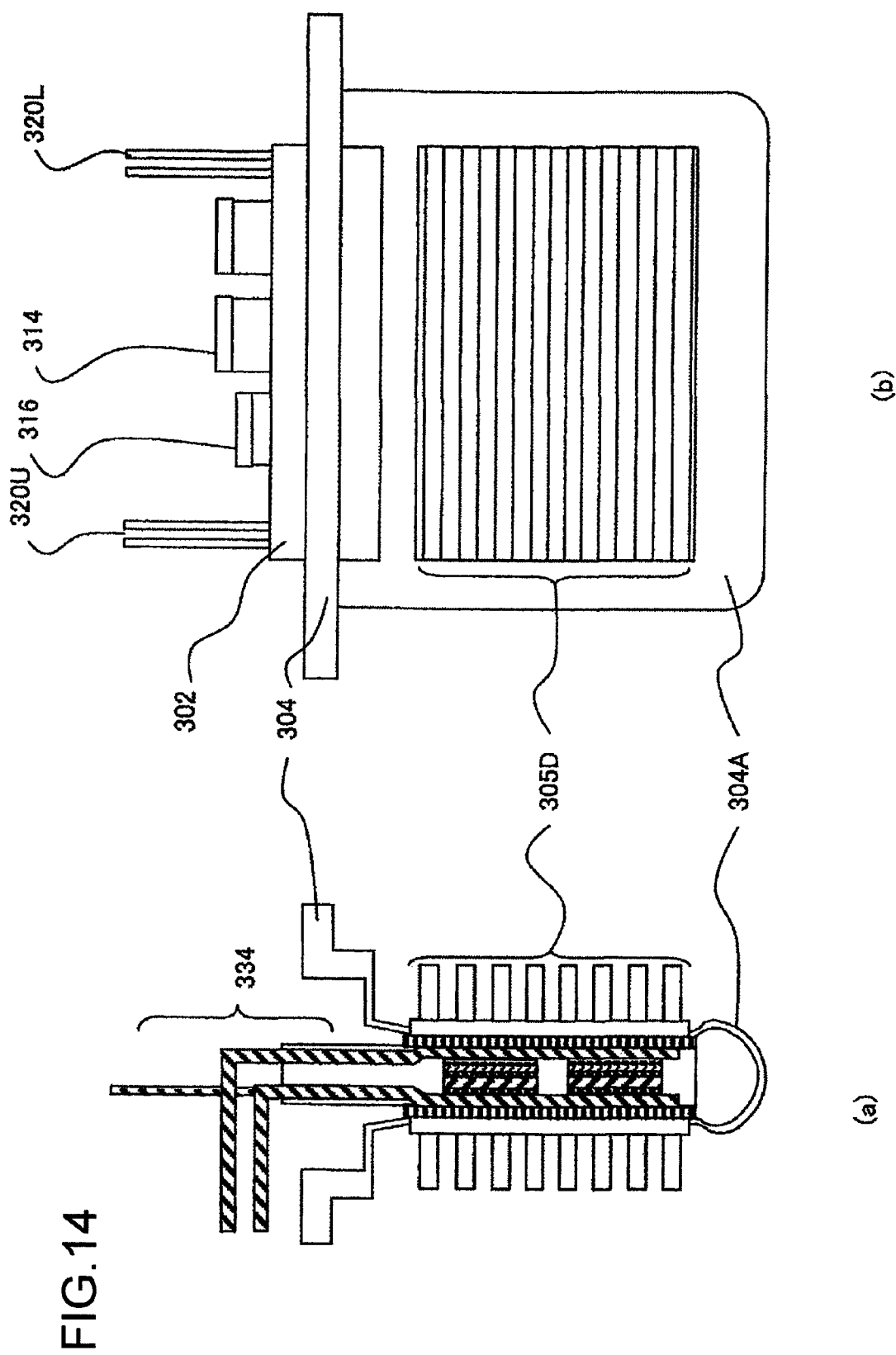
FIG. 14(a) is a sectional view of the fourth power module according to an embodiment of the present invention and FIG. 14(b) is a side view of the fourth power module.

FIG. 14 (a) is a sectional view of a fourth power module 300 according to the present embodiment, and FIG. 14 (b) is a side view of the fourth power module 300.

The difference from the above embodiments lies in that the fins 305 provided on the cooling surface outside the CAN-like heat dissipating base 304 are straight fins 305D, and in that the fins are made of the same material as that of the CAN-like heat dissipating base 304 and formed integrally with the CAN-like heat dissipating base 304.

According to the present embodiment, the fins 305 are configured to be straight shapes so as to make production easy and reduce pressure loss that occurs in the cooling flow path. This achieves reduction in thermal resistance of the power module 300, and thus the power module and the power converter device can be reduced in size.

Figure 15:
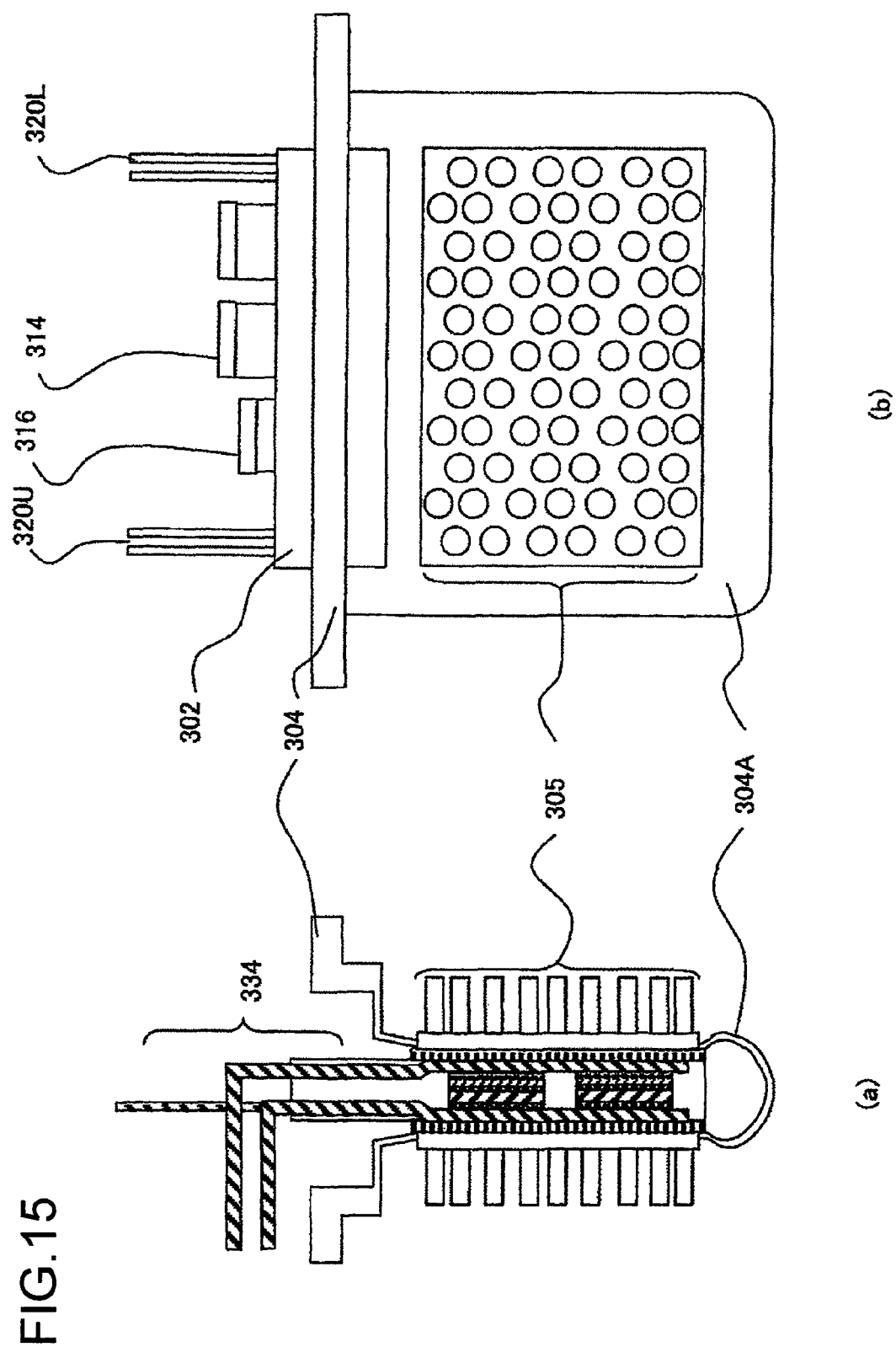
FIG. 15(a) is a sectional view of the fifth power module according to an embodiment of the present invention and FIG. 15(b) is a side view of the fifth power module.

FIG. 15 (a) is a sectional view of a fifth power module 300 according to the present embodiment, and FIG. 15 (b) is a side view of the fifth power module 300.

The difference from the above embodiments lies in that the layout of the pin shape fins 305 provided on the cooling surface outside the CAN-like heat dissipating base 304 are provided with a density variation, i.e., fins 305 far from the power semiconductor are arranged at small intervals and fins 305 in the vicinity of the power semiconductor are arranged at large intervals so as to increase the flow rate of the cooling medium flowing through the fins 305 positioned in the vicinity of the power semiconductor.

According to the present embodiment, since the flow rate of the cooling medium flowing through the fins 305 in the vicinity of the power semiconductor can be increased, the heat transfer rate in the vicinity of the power semiconductor can be increased. This achieves reduction in thermal resistance of the cooling medium and the power semiconductor, and thus the power module and the power converter device can be reduced in size.

Figure 16:
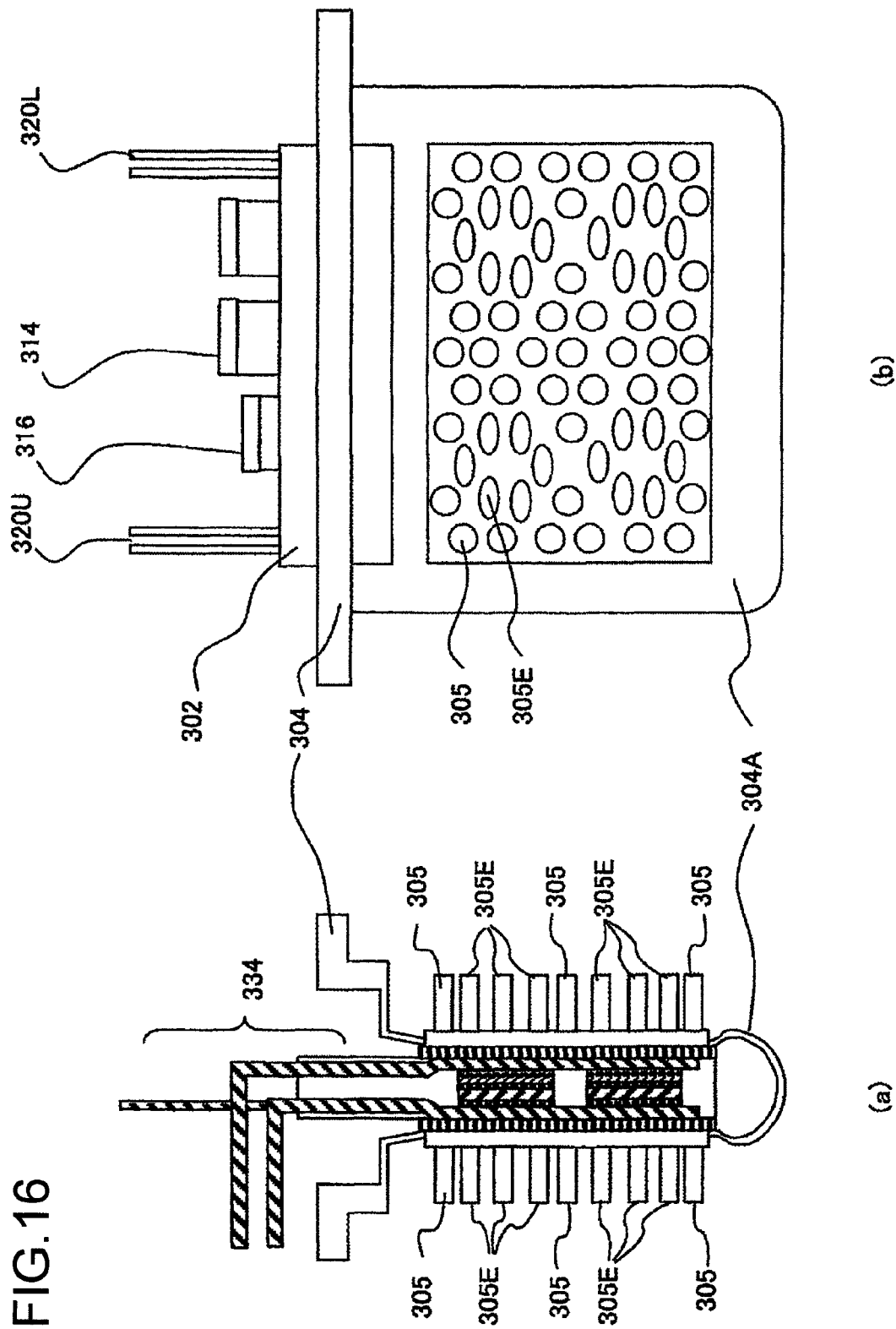
FIG. 16(a) is a sectional view of the sixth power module according to an embodiment of the present invention and FIG. 16(b) is a side view of the sixth power module.

FIG. 16 (a) is a sectional view of a sixth power module 300 according to the present embodiment, and FIG. 16 (b) is a side view of the sixth power module 300.

The difference from the above embodiments lies in that the layout of the pin shape fins 305 provided on the cooling surface outside the CAN-like heat dissipating base 304 are provided with a density variation, i.e., fins 305 far from the power semiconductor are arranged at small intervals and fins 305 in the vicinity of the power semiconductor are arranged at large intervals so as to increase the flow rate of the cooling medium flowing through the fins 305 positioned in the vicinity of the power semiconductor, and in addition, the fins 305 in the vicinity of the power semiconductor are shaped into ellipse-like, i.e., elliptic fins 305E.

According to the present embodiment, since the flow rate of the cooling medium flowing through the fins 305 in the vicinity of the power semiconductor can be increased, the heat transfer rate in the vicinity of the power semiconductor can be increased. In addition, the fins 305 in the vicinity of the power semiconductor are shaped into ellipse-like, and thus the surface area of the fins 305 are increased and the heat transfer rate can be increased. This achieves reduction in thermal resistance of the cooling medium and the power semiconductor, and thus the power module and the power converter device can be reduced in size.

Figure 17:
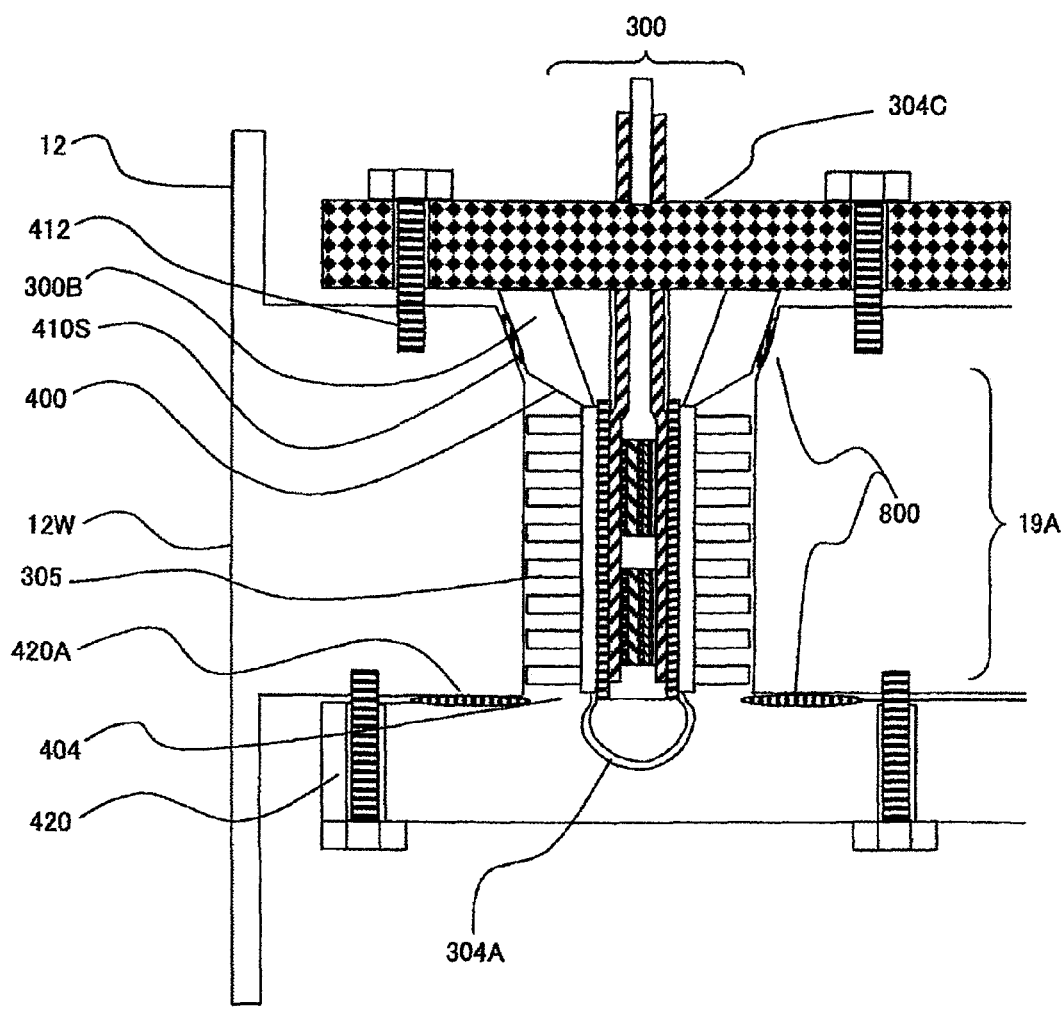
FIG. 17 is a seal structure diagram of a cooling jacket and the power module of the power converter device according to an embodiment of the present invention.

FIG. 17 is a sectional view showing the seal section of the power module 300 and the cooling jacket 19A according to the present embodiment.

In FIG. 17, the cooling jacket 19A is formed integrally with the housing 12 across the middle portion of the housing peripheral wall 12W, and the opening 400 is provided on the upper surface of the cooling jacket 19A and the opening 404 of the cooling water path is provided on the lower surface thereof. The power module mounting surface 410S is provided on the periphery of the opening 400. An engagement section 420A for engagement with the lower cooling water path cover 420, is provided on the periphery of the opening 404 and sealed with the liquid seal material 800. The threaded holes 412 are screw holes for fixing to the cooling jacket 19A the module fixture 304C for pressing a flange 300B of the power module 300 to the mounting surface 410S. Since the plurality of power modules 300 can be pressed to the cooling jacket 19A with the module fixture 304C, the liquid seal material applied in advance between the mounting surface 410S and the flange 300B of the power module 300 is crushed and pressed, thereby inhibiting the cooling medium from leaking through between the mounting surface 410S and the power module 300. The number of screws that press and fix the power module 300 to the cooling jacket can be reduced, and hence assemblability can be improved. The flange 300B of the power module 300 is tilted to form a taper, so that the flange 300B can be reduced in width while maintaining the sealed area. As a result, the cooling jacket 19A can be reduced in size and the flange 300B of the CAN-like heat dissipating base 304 of the power module can be reduced in size, the cooling jacket 19A, the housing 12, and the power module 300 can be reduced in size, thereby contributing greatly to reduction in size of the power converter device 200. The power semiconductors built in to the power module 300 can be cooled from the both sides with the divided cooling water, thereby having an advantage of reduction in thermal resistance. It is to be noted that a rubber O-ring or the like have a similar effect to the liquid seal material 800.

Figure 18:
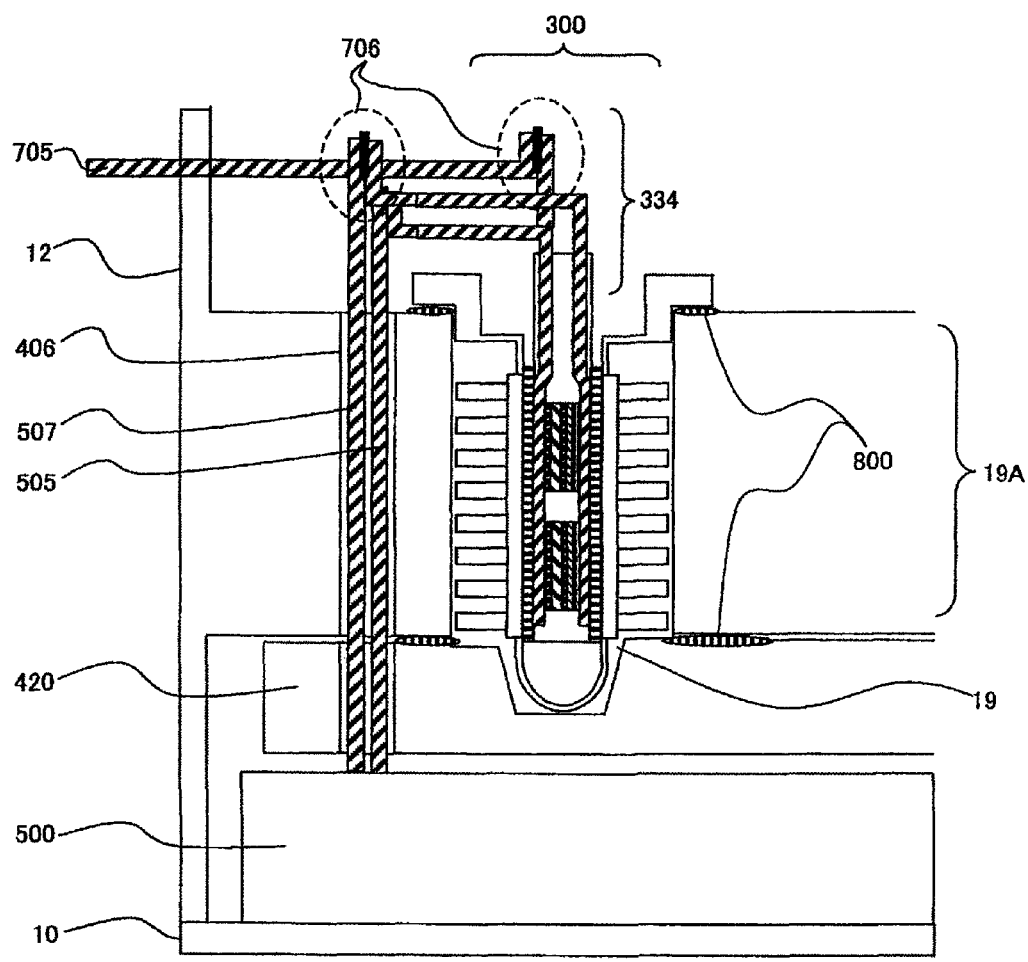
FIG. 18 is a sectional view showing the connection structure of an input/output terminal of the power module of the power converter device according to an embodiment of the present invention.

FIG. 18 is a sectional view showing the connection structure of an input/output terminal of the power module 300 according to the present embodiment.

In FIG. 18, the through hole 406 is formed in parallel to each of the power modules 300 on the dividing wall portion of the cooling water flow path 19 going back and forth in S shape. The capacitor module 500 is disposed across the cooling water flow path 19 with respect to the power module 300, and the power module 300 and the capacitor module 500 can electrically contact through the through hole 406. The positive conductor plate 507 of the capacitor module 500 and the negative conductor plate 505 of the capacitor module 500 are arranged through the through hole 406 of the vicinity of the power module 300. Each of the electrical wiring boards 334 extending from the power module 300 is arranged in close proximity to the positive electrode-side conductor plate 507, the negative electrode-side conductor plate 505, and an output wiring 705. A braze material 706 is disposed in advance on each of the electrical wiring boards 334 or on a part of the positive electrode-side conductor plate 507, the negative electrode-side conductor plate 505, and the output wiring 705. Through the disposed braze material 706, each of the electrical wiring boards 334 is placed opposite to the positive electrode-side conductor plate 507 and the negative electrode-side conductor plate 505, and opposite to the output wiring 705. An electrical current is caused to flow through between each of the electrical wiring boards 334 and the positive electrode-side conductor plate 507, the negative electrode-side conductor plate 505 and the output wiring 705 via the braze material so as to heat the braze material 706, each of the electrical wiring boards 334, the positive electrode-side conductor plate 507, the negative electrode-side conductor plate 505 and the output wiring 705. As a result, the braze material 706 is molten so as to connect each of the electrical wiring boards 334 with the positive electrode-side conductor plate 507, the negative electrode-side conductor plate 505, and the output wiring 705.

According to the present embodiment, since the power wiring can be electrically connected without using a fixing area for a bolt or the like, the electric power wiring area can be reduced in size, and thus reduction in size of the power converter device can be achieved. As no bolt is used, the length of time for assembly can be reduced, and assemblability can be improved, thereby contributing to reduction in cost.

Figure 19:
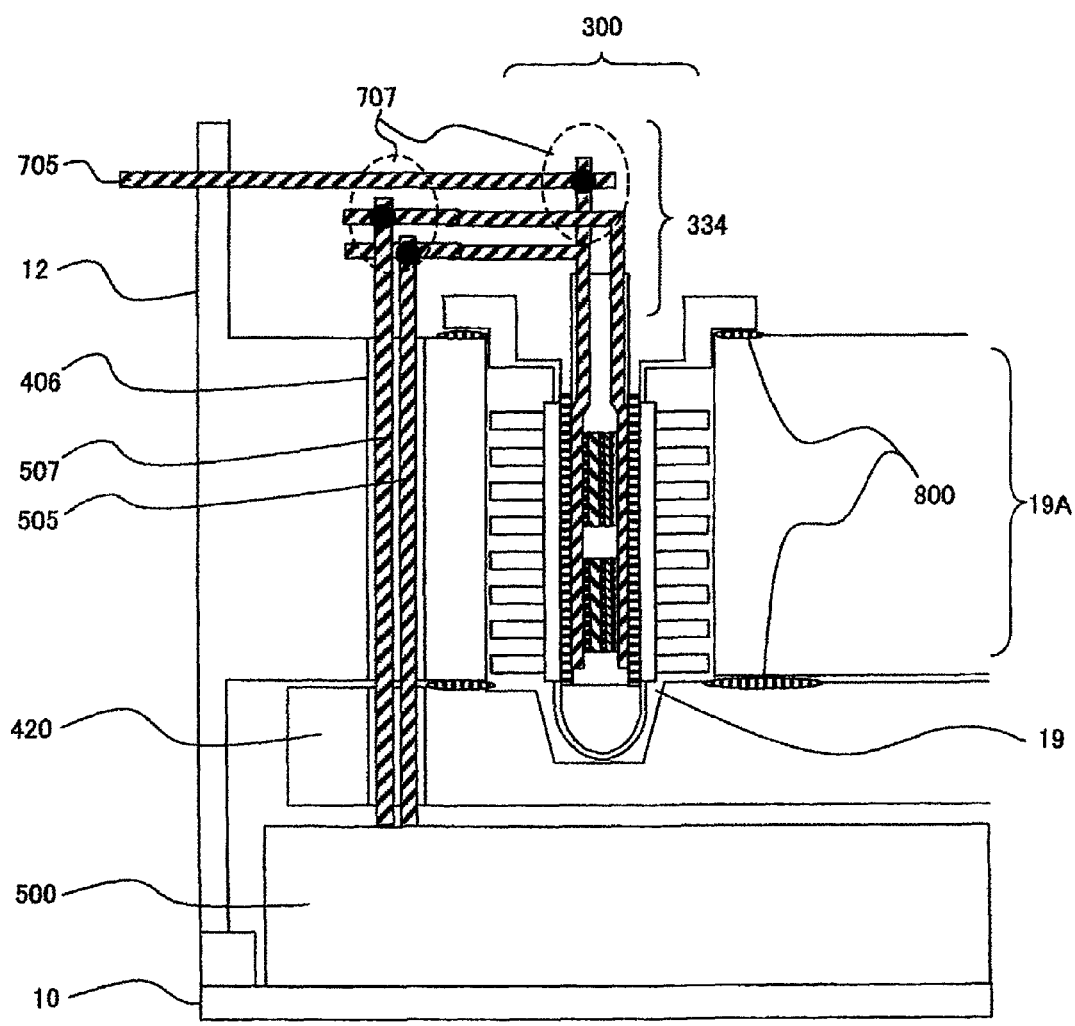
FIG. 19 is a sectional view showing the connection structure of the input/output terminal of the power module of the power converter device according to an embodiment of the present invention.

FIG. 19 is a sectional view showing the connection structure of the input/output terminal of the power module 300 according to the present embodiment.

In FIG. 19, the through hole 406 is formed in parallel to each of the power modules 300 on the dividing wall portion of the cooling water flow path 19 going back and forth in S shape. The capacitor module 500 is disposed across the cooling water flow path 19 with respect to the power module 300, and the power module 300 and the capacitor module 500 can electrically contact through the through hole 406. The positive conductor plate 507 of the capacitor module 500 and the negative conductor plate 505 of the capacitor module 500 are arranged through the through hole 406 in the vicinity of the power module 300. Each of the electrical wiring boards 334 extending from the power module 300 is arranged in close proximity to the positive electrode-side conductor plate 507, the negative electrode-side conductor plate 505, and an output wiring 705. Pressure is applied to each of the electrical wiring boards 334 or to part of the positive electrode-side conductor plate 507, the negative electrode-side conductor plate 505, and the output wiring 705, and each of the conductor plates is fixed by arc welding, micro TIG welding, laser welding, or the like at a specific connection point, so as to constitute an electrical connection point 707.

According to the present embodiment, since the power wiring can be electrically connected without using a fixing area for a bolt or the like, the electric power wiring area can be reduced in size, and thus reduction in size of the power converter device can be achieved. As no bolt is used, the length of time for assembly can be reduced, and assemblability can be improved, thereby contributing to reduction in cost.

Figure 20:
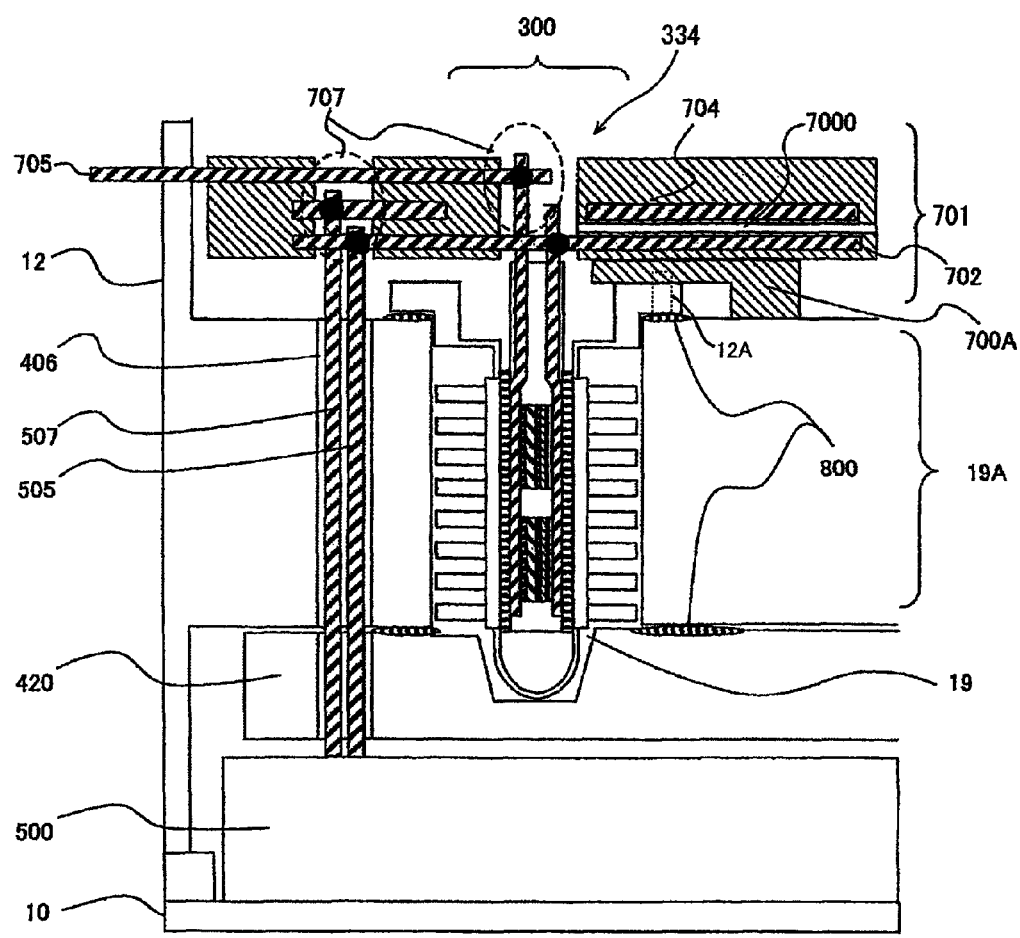
FIG. 20 is a sectional view showing the connection structure of the input/output terminal of the power module of the power converter device according to an embodiment of the present invention.

FIG. 20 is a sectional view showing the electric power wiring structure connected with the input/output terminal of the power module 300 according to the present embodiment.

In FIG. 20, the through hole 406 is formed in parallel to each of the power modules 300 on the dividing wall portion of the cooling water flow path 19 going back and forth in S shape. The capacitor module 500 is disposed across the cooling water flow path 19 with respect to the power module 300, and the power module 300 and the capacitor module 500 can electrically contact through the through hole 406. There are arranged the negative electrode-side conductor plate 704 connected with the positive conductor plate 507 of the capacitor module 500 and the positive electrode-side conductor plate 702 connected with the negative conductor plate 505 of the capacitor module 500 through the through hole 406 provided in the vicinity of the power module 300. An electric power wiring unit 701, which is constituted by laminating the electric power wiring, which electrically connects each of the electrical wiring boards 334 of the power module 300 with the positive electrode-side conductor plate 702 and the negative electrode-side conductor plate 704, and the output wiring 705 through a resin, is placed above the electrical wiring boards 334 of the power module 300. Each of the conductor plates is fixed by arc welding, micro TIG welding, laser welding, or the like at a specific connection point, so as to constitute the electrical connection point 707. In addition, a pressure fixture 700A that fixes the power module 300 to the cooling jacket 19A is integrated with the electric power wiring unit 701 so that the power module 300 can be pressed and fixed in the cooling water path 19. Since slag is produced in arc welding or the like, the power module 300 may be attached and wired with the electric power wiring unit 701 before inserted into the housing 12 to assemble the inverter device 200.

According to the present embodiment, as the electric power wirings are integrated by laminated with a resin so that the heat capacity in the vicinity of the welded part is increased, temperature rise in the power module 300 due to temperature rise during welding can be reduced as much as possible. In addition, no temperature rise occurs in the power module 300 even if the distance from the welding point to the power module 300 is reduced. Alignment of the welding point is performed using a reference point 12A prepared in the housing 12, positions of the electric power wiring unit and the power module 300 can be fixed, and thus misalignment during welding can be reduced, thereby allowing a highly reliable electrical connection point to be formed. A protruding portion that protrudes from a position opposite to the flange of the power module 300 is formed in the cooling jacket 19A at the reference point 12A. The protruding portion protrudes from the cooling jacket 19A through a through hole formed on the flange of the power module 300, and the tip section of the protruding portion reaches the pressure fixture 700A. Since the tip of the protruding portion is fixed with the pressure fixture 700A, an insulation with the positive electrode-side conductor plate 702 is secured.

Here, a structure in which the insulation sheet 7000 is sandwiched between the positive conductor plate 702 and the negative conductor plate 704 may be adopted. This allows the distance between the conductor plates to be reduced and the conductor components can be reduced in size.

Figure 21:
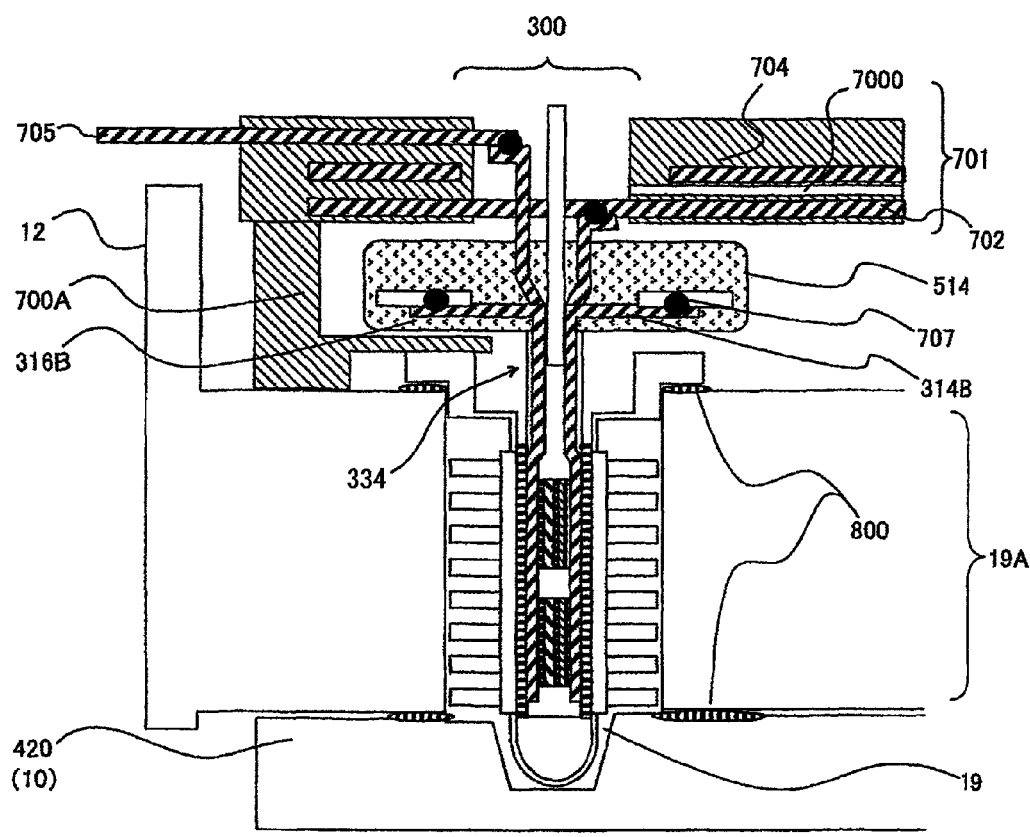
FIG. 21 is a sectional view showing the structure of the power module and the capacitor of the power converter device according to an embodiment of the present invention.

FIG. 21 is a sectional view showing the input/output terminal and the capacitor structure of the power module 300 according to the present embodiment.

In FIG. 21, each of the power modules 300 is placed at a predetermined position in the cooling water flow path 19 going back and forth in S shape. The electric power wiring unit 701 connected with the electrical wiring board 334 of the power module 300 is disposed above the power module 300, and the capacitor 514 is disposed between the electric power wiring unit 701 and the cooling water flow path 19. A connection section between the capacitor 514 and the electrical wiring boards 334 is provided between the electric power wiring unit 701 and the cooling water flow path 19, and drawing sections 314B and 316B engaged with an electrical connection terminal of the capacitor 514 are formed on the electrical wiring boards 334. The drawing sections 314B and 316B and each of the electrical wiring boards 334 of the power module 300 are fixed by arc welding, micro TIG welding, laser welding, or the like at a predetermined connection point, so as to constitute the electrical connection point 707. The pressure fixture 700A that fixes the power module 300 to the cooling jacket 19A is integrated with the electric power wiring unit 701, so that the power module 300 can be pressed and fixed to the cooling water path 19. Since slag is produced in arc welding or the like, the power module 300 and the capacitors 514 and 500 may be attached and wired to the electric power wiring unit 701 before inserted into the housing 12 to assemble the inverter device 200.

According to the present embodiment, the capacitor 514 is disposed between the electric power wiring unit and the cooling water flow path 19 so that the wiring distance between the power module 300 and the capacitor 514 can be reduced significantly. This allows the wiring inductance to be reduced, the surge voltage generated upon switching the power semiconductors to be reduced, and, in addition, switching loss and noise generation in the power semiconductors to be reduced. As a result, a power module can be reduced in size and a small-sized, highly-reliable power converter device can be achieved.

Figure 22:
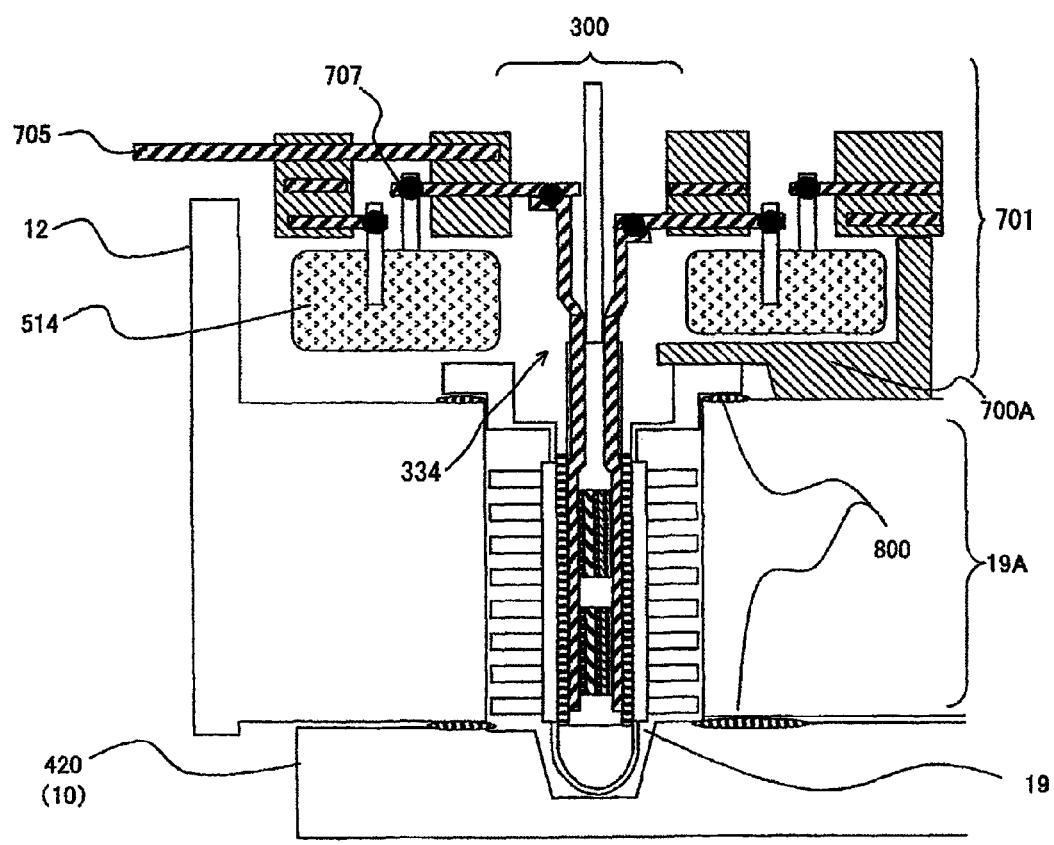
FIG. 22 is a sectional view showing the structure of the power module and the capacitor of the power converter device according to an embodiment of the present invention.

FIG. 22 is a sectional view showing the input/output terminal and the capacitor structure of the power module 300 according to the present embodiment.

In FIG. 22, each of the power modules 300 is placed at a predetermined position in the cooling water flow path 19 going back and forth in S shape. The electric power wiring unit 701 connected with the electrical wiring boards 334 of the power module 300 is disposed above the power module 300, and the capacitor 514 is disposed between the electric power wiring unit 701 and the cooling water flow path 19. The embodiment shown in FIG. 22 has a structure in which the electric power wiring to be connected with the negative electrode and the positive electrode of the power module 300, which is built in to the electric power wiring unit 701, and the electrical connection terminal of the capacitor 514 are connected so as to integrate the capacitor 514 with the electric power wiring unit 701. Each of the electric power wiring is fixed by arc welding, micro TIG welding, laser welding, or the like at a specific connection point, so as to constitute the electrical connection point 707. In addition, the pressure fixture 700A that fixes the power module 300 to the cooling jacket 19A is integrated with the electric power wiring unit 701, so that the power module 300 can be pressed and fixed to the cooling water path 19. In addition, since slag is produced in arc welding or the like, the power module 300 and the capacitor 514 may be attached and wired to the electric power wiring unit 701 before inserted into the housing 12 to assemble the inverter device 200.

According to the present embodiment, the capacitor 514 is integrated with the electric power wiring unit so that the wiring distance between the power module 300 and the capacitor 514 can be reduced significantly. This allows the wiring inductance to be reduced, the surge voltage generated upon switching the power semiconductors to be reduced, and, in addition, switching loss and noise generation in the power semiconductors to be reduced. As a result, a power module can be reduced in size and a small-sized, highly-reliable power converter unit can be achieved.

Figure 23:
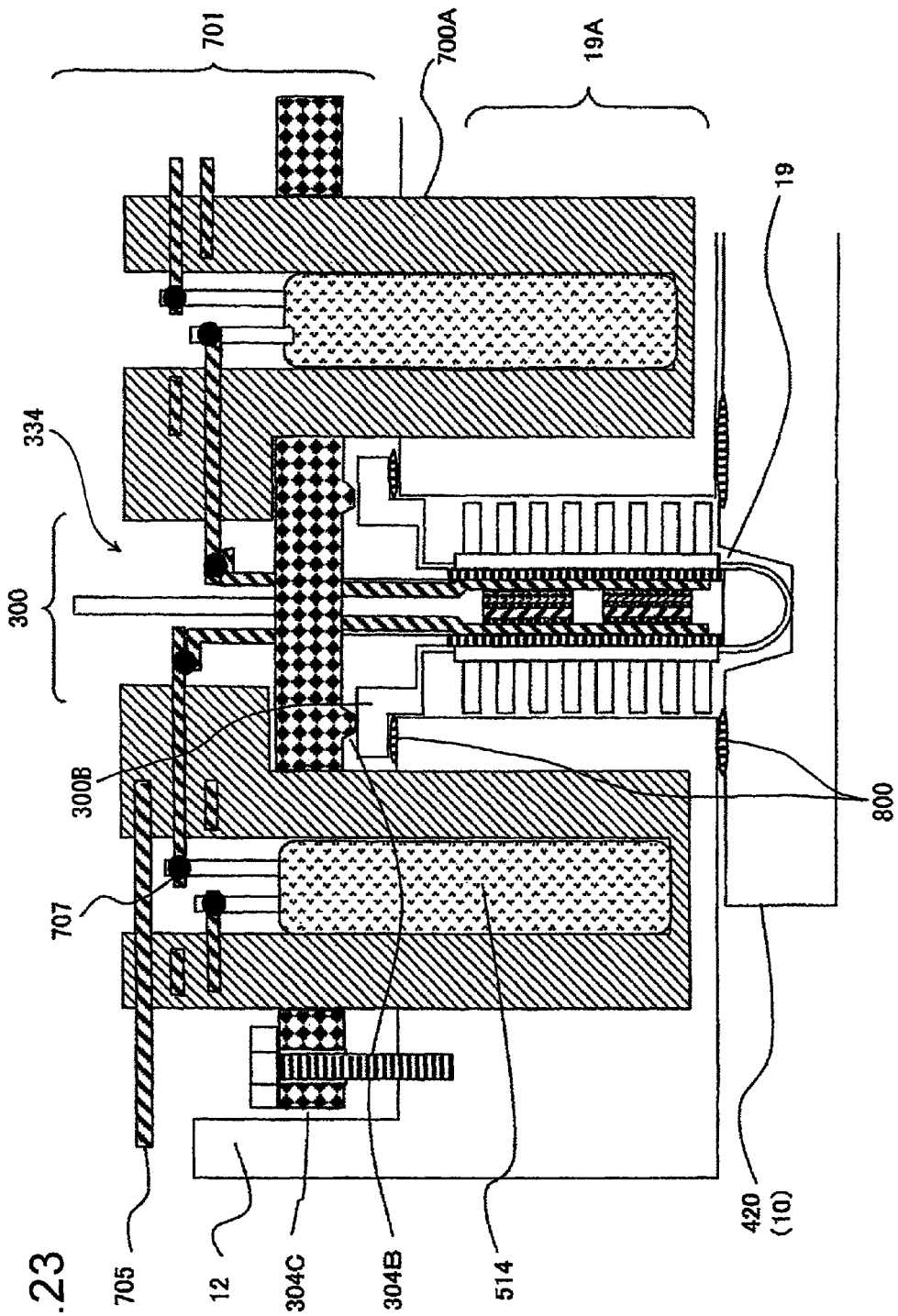
FIG. 23 is a sectional view showing a fixation method of the power module and the capacitor structure of the power converter device according to an embodiment of the present invention.

FIG. 23 is a sectional view illustrating the fixation method and the capacitor structure of the power module 300 according to the present embodiment.

In FIG. 23, each of the power modules 300 is arranged at a predetermined position in the cooling water path 19 going back and forth in S shape, and the module fixture 304C that applies pressure to the power module and fixes the power module 300 to the cooling water path 19 is disposed above the flange 300B of the power module 300. Protrusions 304B are provided on the module fixture 304C so that the module fixture has point-contact with the flange 300B of the power module 300, and the protrusions 304B press the upper surface of the flange 300B. For this reason, the pressure applied to the flange 300B is uniformly distributed to the cooling jacket 19A to equally crush the liquid seal 800, and thus unevenness of pressure force due to deformation of the module fixture 304C can be reduced.

The electric power wiring unit 701 connected with the electrical wiring boards 334 of the power module 300 is disposed above the power module 300. The cooling jacket 19A is provided with openings in parallel with the cooling water path 19, and the capacitor 514 which is disposed partially in the electric power wiring unit 701 can be housed in the opening so as to cool the capacitor 514 with the cooling water directly or through the inner wall of the cooling jacket 19A. The electric power wiring connected with the negative electrode and the positive electrode of the power module 300 and the electrical connection terminals of the capacitor 514 are connected, and the capacitor 514 is integrated with the electric power wiring unit 701. Each of the electric power wiring is fixed by arc welding, micro TIG welding, laser welding, or the like at a predetermined connection point, so as to constitute the electrical connection point 707. Since slag is produced in arc welding or the like, the power module 300 and the capacitor 514 are attached to the electric power wiring unit 701 and wiring is completed before inserted into the housing 12 to assemble the inverter device 200.

According to the present embodiment, the capacitor 514 is integrated with the electric power wiring unit 701 so that the power module 300 and the capacitor 514 can be efficiently cooled. In addition, since the wiring distance for connecting each unit can be reduced, the wiring inductance can be reduced, and the acceptable value of the ripple current at the capacitor 514 can be improved. The surge voltage generated upon switching the power semiconductors can be reduced, and switching loss and noise generation in the power semiconductors can be reduced. As a result, a power module can be reduced in size, a capacitor can be reduced in size, and a small-sized, highly-reliable power converter unit can be achieved.

Figure 24:
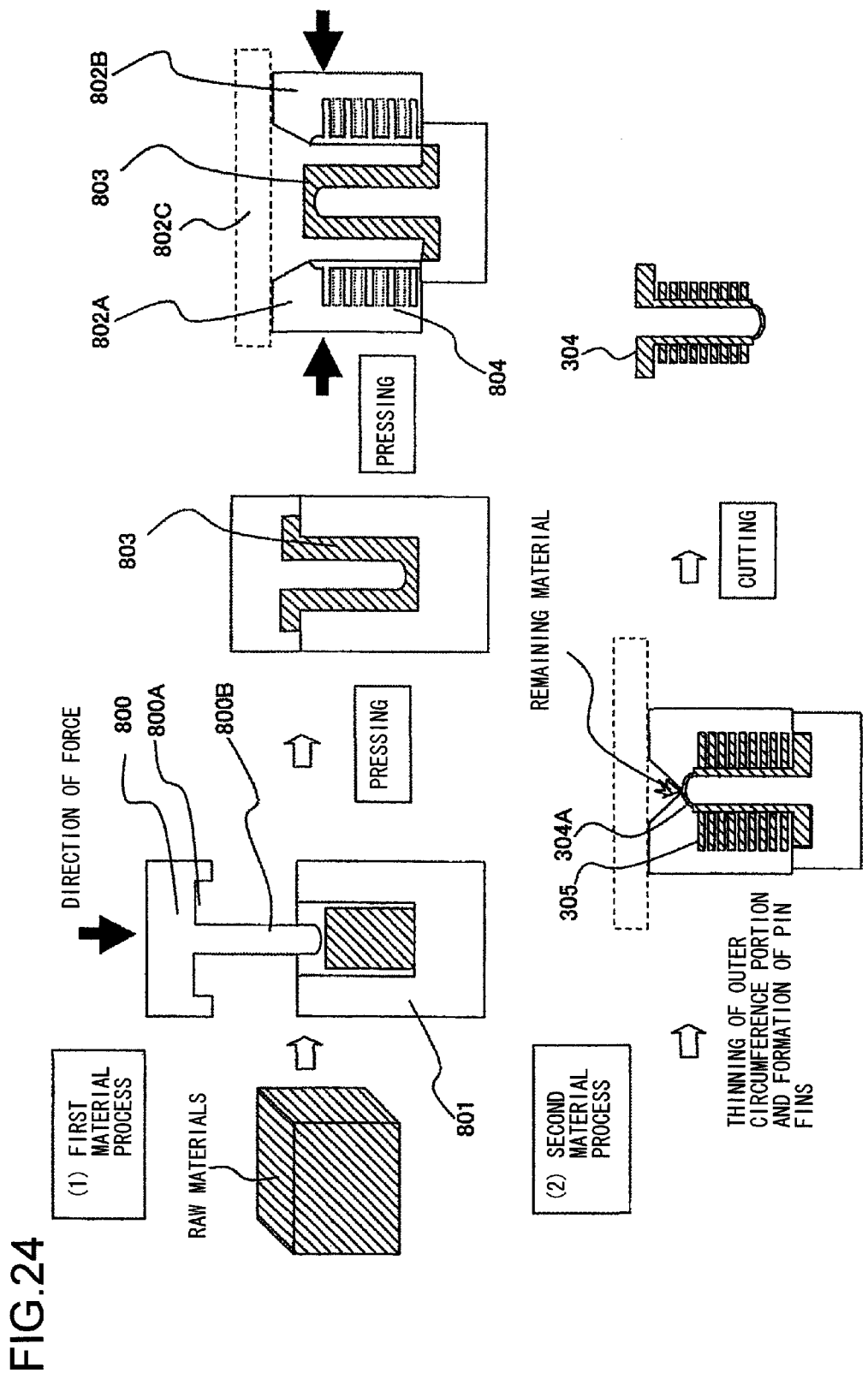
FIG. 24 is an illustration of a process flow showing a production method of the CAN-like heat dissipating base 304 of the power module 300 according to the present embodiment.

FIG. 24 is an illustration of the process flow showing the production method of the CAN-like heat dissipating base 304 of the power module 300 according to the present embodiment.

In FIG. 24, the first process (1) is a process for deforming a raw material of the CAN-like heat dissipating base 304 into a substantially heat dissipating base shape, and the raw material is put into a CAN-like hole prepared in a mold 801. The raw material is deformable metal such as aluminium or copper, or powdered metal. A protruding portion 800B for forming an opening that works as a housing of the power semiconductor and a groove 800A for forming a flange engaged with the cooling jacket 19A are formed in a mold 800. By performing pressing to engage the mold 800 and the mold 801, a primary forming CAN-like cooling member 803 is formed. Next, the second process (2) is a process in which fins are formed in the primary forming CAN-like cooling member 803 produced in the first process. Fin forming dies 802A and 802B are provided with a plurality of holes 804 through which pin-like fins are formed. By inserting the primary forming CAN-like cooling member 803 into a mold in the same shape as the mold 801 and pressing the fin forming dies 802A and 802B placed on the both sides, the fins 305 of the CAN-like heat dissipating base 304 and the thin-walled outer circumference curved portion 304A are formed and a remaining material protrudes from between the fin forming dies 802A and 802B. Lastly, height of the formed fins 305 and the protruding remaining material are cut and removed, and thus the CAN-like heat dissipating base 304 is completed.

After completion, the surface of the CAN-like heat dissipating base 304 may be washed or a process to reduce surface roughness may be performed by chemical polishing or the like.

According to the present embodiment, the CAN-like heat dissipating base 304, which has the exterior wall formed of the same material that is seamless with both of the heat dissipating bases so as to cover the periphery of the heat dissipating bases facing each other, the opening prepared on the part of the exterior wall, and the power semiconductors housed in the opening, can be produced with ease in the two pressing processes. With this method, reliability and strength during deformation due to metal corrosion, cooling water pressure, and the like can be maintained over a long period of time, compared to a CAN-like heat dissipating base having a seam of welding or the like. In addition, deformation due to thermal stress generated during welding and its residual stress can be prevented, and thus, uneven thickness, rip, and the like of the built-in power semiconductors and the insulation sheet 334A, which is an adhesive insulation layer, can be prevented. Moreover, the growth in size of fins due to flange for welding or the like can be prevented, so that the highly-reliable, small-sized double-sided cooling the power module 300 can be configured, thereby achieving a small-sized, highly-reliable power converter device.

It is to be noted that the end portion of the outer circumference curved portion 304A, which works as a connecting member, may be formed in a tapered shape or may be configured so as to have curvature of a predetermined value or more.

The present application is based upon Japanese Patent Application No. 2008-280682 (filed on Oct. 31, 2008), and hereby incorporates the contents thereof by reference.

The invention claimed is:

1. A power module comprising:
a semiconductor circuit unit for converting direct current power to alternating current power; and
a cylindrical case for accommodating the semiconductor circuit unit, with the cylindrical case including a bottom; wherein:
the cylindrical case further includes two base plates with their main surfaces facing each other;
the two base plates are connected to each other through a connecting member;
the connecting member covers a periphery of the base plates;
a rigidity of the connecting member is less than a rigidity of each of the base plates;
fins are formed on a surface of each of the two base plates; and
an outer circumference of the two base plates, viewed from a direction perpendicular to the surface on which the fins are formed, is covered by the connecting member.

2. A power module comprising:
a semiconductor circuit unit for converting direct current power to alternating current power; and
a cylindrical case for accommodating the semiconductor circuit unit, with the cylindrical case including a bottom; wherein:
the cylindrical case further includes two base plates with their main surfaces facing each other;
the two base plates are connected to each other through a connecting member;
the connecting member covers a periphery of the base plates;
a thickness of the connecting member is less than a thickness of each of the base plates;
fins are formed on a surface of each of the two base plates; and
an outer circumference of the two base plates, viewed from a direction perpendicular to the surface on which the fins are formed, is covered by the connecting member.

3. The power module according to claim 1, wherein:
the semiconductor circuit unit is disposed between the two base plates;

the connecting member is connected to the two base plates and forms a housing region in which the semiconductor circuit unit is housed;

the connecting member includes a circumference section that surrounds an outer circumference of one of the two base plates; and a rigidity of the circumference section is less than a rigidity of each of the base plates.

4. The power module according to claim 3, wherein:

the semiconductor circuit unit is disposed between the two base plates;

the connecting member is connected to the two base plates and forms a housing region in which the semiconductor circuit unit is housed;

the connecting member includes a circumference section that surrounds an outer circumference of one of the two base plates; and a thickness of the circumference section is less than a thickness of each of the base plates.

5. The power module according to claim 1, further comprising:

an insulating member that is placed between one of the two base plates and the semiconductor circuit unit, wherein:

the insulating member is adhesive to the one of the base plates and to the semiconductor circuit unit.

6. The power module according to claim 5, wherein:

the insulating member is an insulation sheet made from a mixture of an epoxy resin and a thermally conductive filler.

7. The power module according to clam 11, further comprising:

a first insulating member that is disposed between one of the two base plates and the semiconductor circuit unit; and a second insulating member that is disposed between another of the two base plates and the semiconductor circuit unit, wherein:

the semiconductor circuit unit is sandwiched and held between the two base plates through the first insulating member and the second insulating member.

8. The power module according to claim 1, wherein:

the two base plates are formed integrally with the connecting member.

9. The power module according to claim 1, wherein:

the semiconductor circuit unit is disposed on one side of each of the two base plates, and fins are formed on a surface that is another side of each of the two base plates.

10. The power module according to claim 1, wherein:

the semiconductor circuit unit comprises a first semiconductor device unit that is connected to a positive electrode side of a power source and a second semiconductor device unit that is connected to a negative electrode side of the power source; and alternating current power of any one phase among alternating current power of a plurality of phases is output from a connection section of the first semiconductor device unit and a second semiconductor device unit.

11. The power module according to claim 10, further comprising:

a first wiring member that is connected with the first semiconductor device unit; and a second wiring member that is connected with the second semiconductor device unit, wherein:

the first wiring member and the second wiring member are formed in a flat plate-shape and arranged so that at least part of the first wiring member and the second wiring member are in a laminated state.

12. A power converter device for vehicle, comprising:

the power module according to claim 1; and a cooling jacket that forms a flow path through which a cooling medium flows, wherein:

the cooling jacket includes a plurality of openings leading to the flow path;

the power module is provided in a plural, and each power module closes each of the plurality of the openings; and the two base plates of each power module directly contact the cooling medium.

13. The power module according to claim 1, wherein each of the two base plates is connected at a first end thereof to the connecting member, and each of the two base plates is connected to one another at a second end thereof via a curved portion.

14. The power module according to claim 2, wherein each of the two base plates is connected at a first end thereof to the connecting member, and each of the two base plates is connected to one another at a second end thereof via a curved portion.

\* \* \* \* \*